(12) United States Patent
Ge et al.

(10) Patent No.: US 10,103,169 B1
(45) Date of Patent: Oct. 16, 2018

(54) METHOD OF MAKING A THREE-DIMENSIONAL MEMORY DEVICE USING A MULTI-STEP HOT PHOSPHORIC ACID WET ETCH PROCESS

(71) Applicant: SANDISK TECHNOLOGIES LLC, Plano, TX (US)

(72) Inventors: Chun Ge, San Jose, CA (US); Fei Zhou, Milpitas, CA (US); Yanli Zhang, San Jose, CA (US); Raghuveer S. Makala, Campbell, CA (US); Takashi Orimoto, Sunnyvale, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/681,886

(22) Filed: Aug. 21, 2017

(51) Int. Cl.
*H01L 29/792* (2006.01)
*H01L 27/11582* (2017.01)
*H01L 27/1157* (2017.01)
*H01L 21/28* (2006.01)

(52) U.S. Cl.
CPC .. *H01L 27/11582* (2013.01); *H01L 21/28282* (2013.01); *H01L 27/1157* (2013.01)

(58) Field of Classification Search
CPC ......... H01L 27/11582; H01L 21/28282; H01L 27/1157
USPC ....................................................... 257/324
See application file for complete search history.

(56) References Cited

U.S. PATENT DOCUMENTS

| | | | |
|---|---|---|---|
| 5,915,167 A | 6/1999 | Leedy | |
| 8,884,357 B2 | 11/2014 | Wang et al. | |
| 8,946,023 B2 | 2/2015 | Makala et al. | |
| 9,230,987 B2 | 1/2016 | Pachamuthu et al. | |
| 9,449,982 B2 | 9/2016 | Lu et al. | |
| 9,515,080 B2 | 12/2016 | Takahashi et al. | |
| 9,520,406 B2 | 12/2016 | Makala et al. | |
| 9,570,463 B1 | 2/2017 | Zhang et al. | |
| 9,583,500 B2 | 2/2017 | Pachamuthu et al. | |
| 9,627,403 B2 | 4/2017 | Liu et al. | |
| 9,728,551 B1 | 8/2017 | Lu et al. | |
| 2017/0062454 A1 | 3/2017 | Lu et al. | |
| 2017/0236835 A1 | 8/2017 | Nakamura et al. | |
| 2017/0243879 A1 | 8/2017 | Yu et al. | |

OTHER PUBLICATIONS

US 9,689,153, 07/2017, Liu et al. (withdrawn)
U.S. Appl. No. 15/071,575, filed Mar. 16, 2016, SanDisk Technologies LLC.

(Continued)

*Primary Examiner* — Anthony Ho
(74) *Attorney, Agent, or Firm* — The Marbury Law Group PLLC

(57) ABSTRACT

At least one alternating stack of insulating layers and silicon nitride layers is formed over a substrate. Memory stack structures are formed through the at least one alternating stack. A trench and an etch mask spacer are formed such that the trench extends through the entirety of the alternating stack while the etch mask covers upper layers of the at least one alternating stack. Lower silicon nitride layers are removed employing a first hot phosphoric acid wet etch process. After removal of the etch mask spacer, upper silicon nitride layers are removed employing a second hot phosphoric acid wet etch process. Electrically conductive layers are formed in the lateral recesses formed by removal of the silicon nitride layers.

14 Claims, 29 Drawing Sheets

(56) References Cited

OTHER PUBLICATIONS

U.S. Appl. No. 15/183,195, filed Jun. 15, 2016, SanDisk Technologies LLC.
U.S. Appl. No. 15/186,768, filed Jun. 20, 2016, SanDisk Technologies LLC.
U.S. Appl. No. 15/243,260, filed Aug. 22, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
U.S. Appl. No. 15/445,579, filed Feb. 28, 2017, SanDisk Technologies LLC.
U.S. Appl. No. 15/488,924, filed Apr. 17, 2017, SanDisk Technologies LLC.
U.S. Appl. No. 15/593,820, filed May 12, 2017, SanDisk Technologies LLC.
U.S. Appl. No. 15/632,983, filed Jun. 26, 2017, SanDisk Technologies LLC.
U.S. Appl. No. 15/633,131, filed Jun. 26, 2017, SanDisk Technologies LLC.

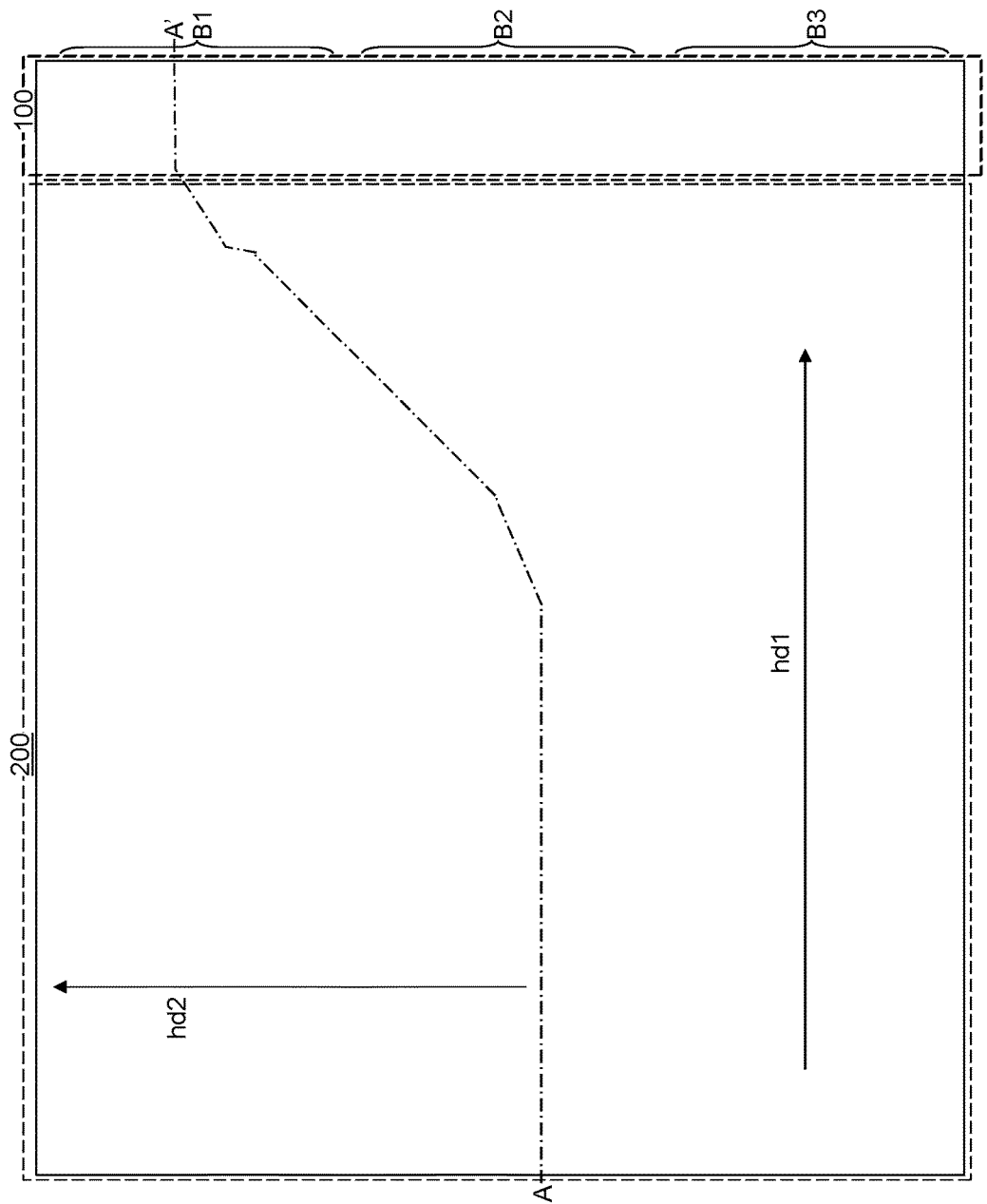

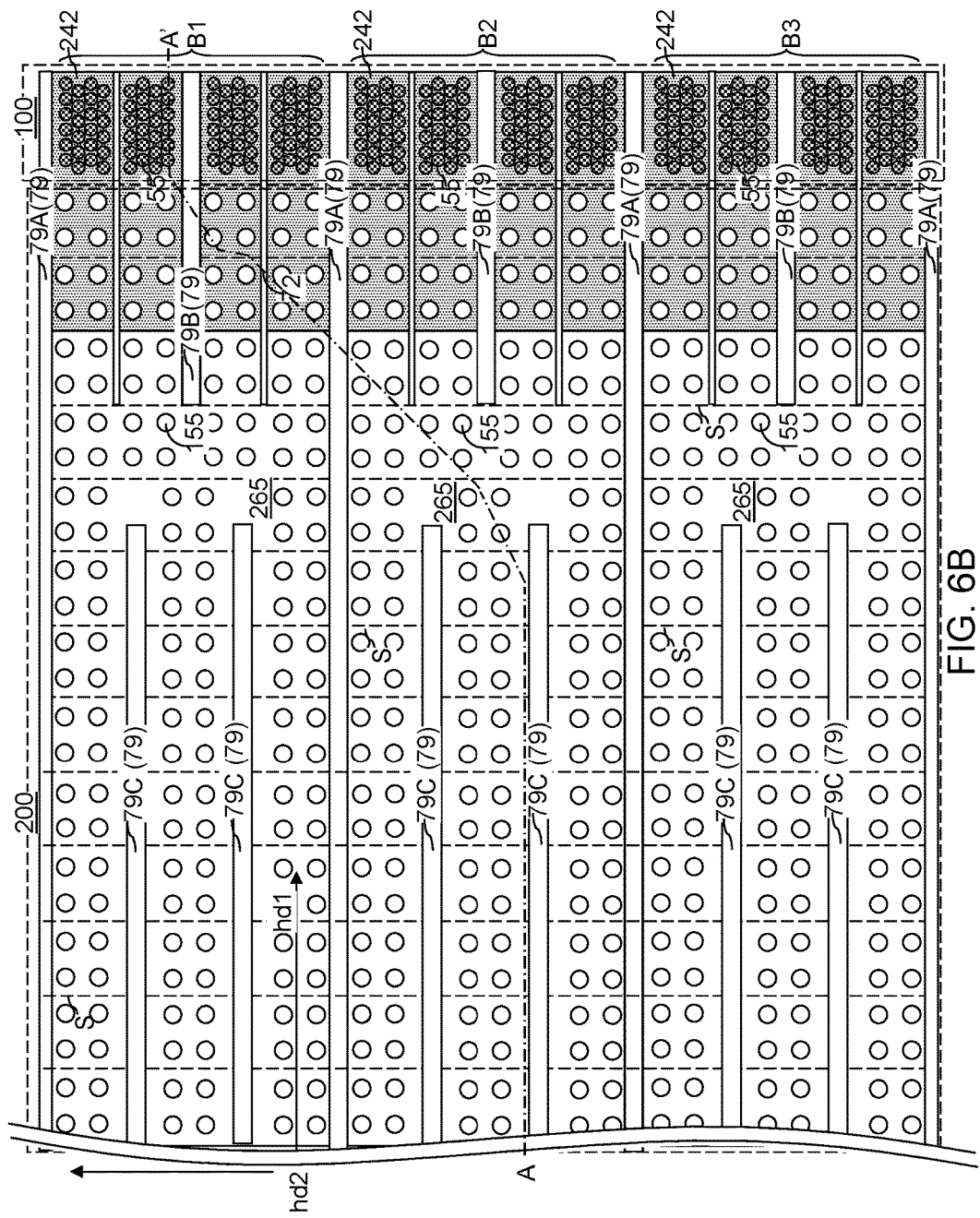

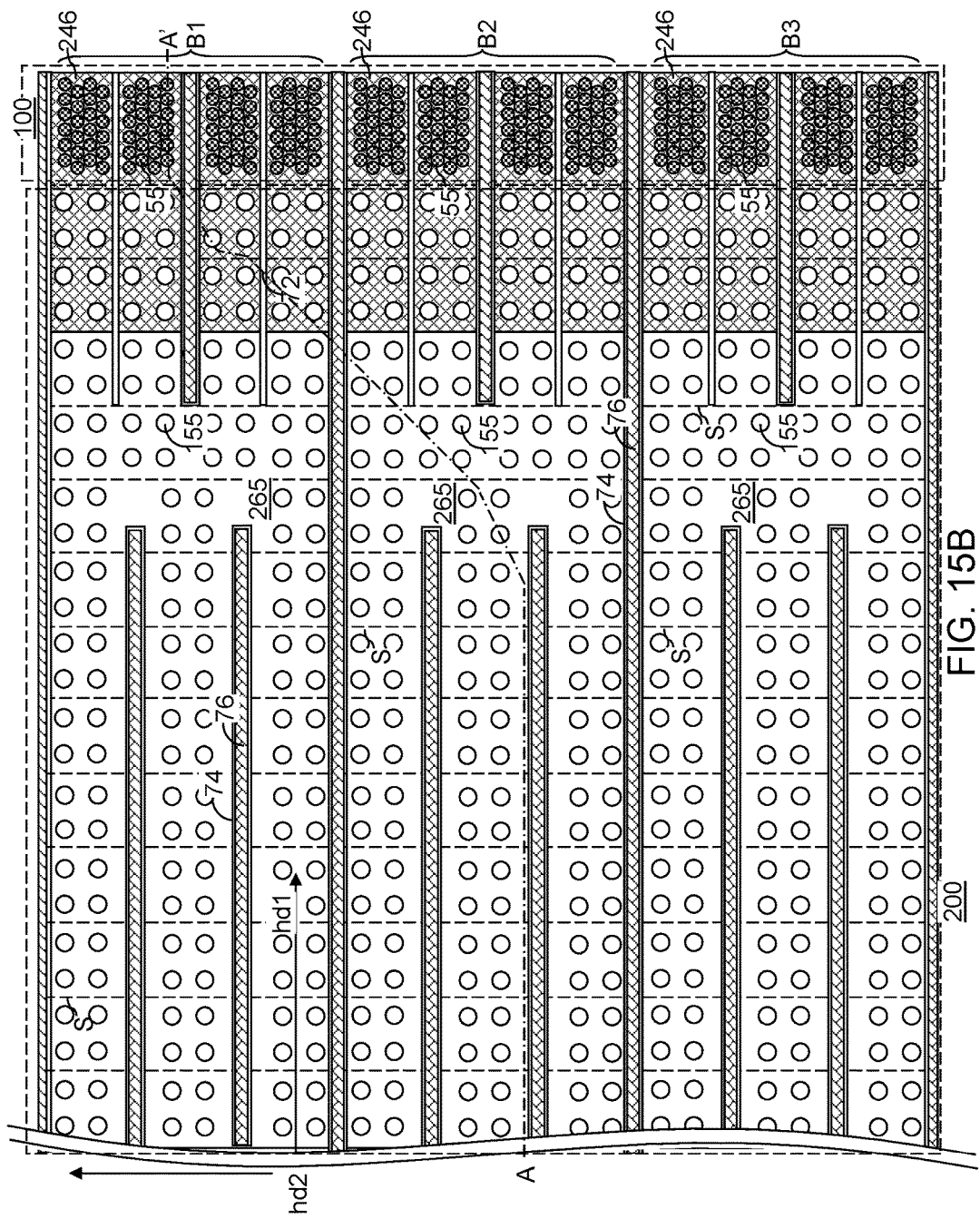

METHOD OF MAKING A THREE-DIMENSIONAL MEMORY DEVICE USING A MULTI-STEP HOT PHOSPHORIC ACID WET ETCH PROCESS

FIELD

The present disclosure relates generally to the field of semiconductor devices, and specifically to methods for multi-step removal of silicon nitride sacrificial layers while preventing silica deposition in alternating stacks during fabrication of a three-dimensional memory device.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a method of forming a three-dimensional memory device is provided. At least one alternating stack of insulating layers and silicon nitride layers is formed over a substrate. Memory stack structures are formed through the at least one alternating stack. A trench is formed through an upper portion of the at least one alternating stack. An etch mask spacer including a material resistant to hot phosphoric acid is formed at a periphery of the trench. The trench is vertically extended through a lower portion of the at least one alternating stack. First lateral recesses are formed by removing a subset of the silicon nitride layers that are not covered by the etch mask spacer selective to the insulating layers employing a first hot phosphoric acid wet etch process. The etch mask spacer is removed. Second lateral recesses are formed by removing a complementary subset of the silicon nitride layers selective to the insulating layers employing a second hot phosphoric acid wet etch process. Electrically conductive layers are formed in the first and second lateral recesses.

BRIEF DESCRIPTION OF THE DRAWINGS

FIG. 1B is a schematic plan view of the exemplary structure of FIG. 1A.

FIG. 6B is a horizontal cross-sectional view of the exemplary structure along the horizontal plane B-B' in FIG. 6A. The zig-zag vertical plane A-A' corresponds to the plane of the vertical cross-sectional view of FIG. 6A.

FIG. 15B is a horizontal cross-sectional view of the exemplary structure along the horizontal plane B-B' in FIG. 15A. The zig-zag vertical plane A-A' corresponds to the plane of the vertical cross-sectional view of FIG. 15A.

DETAILED DESCRIPTION

Figure 1A:
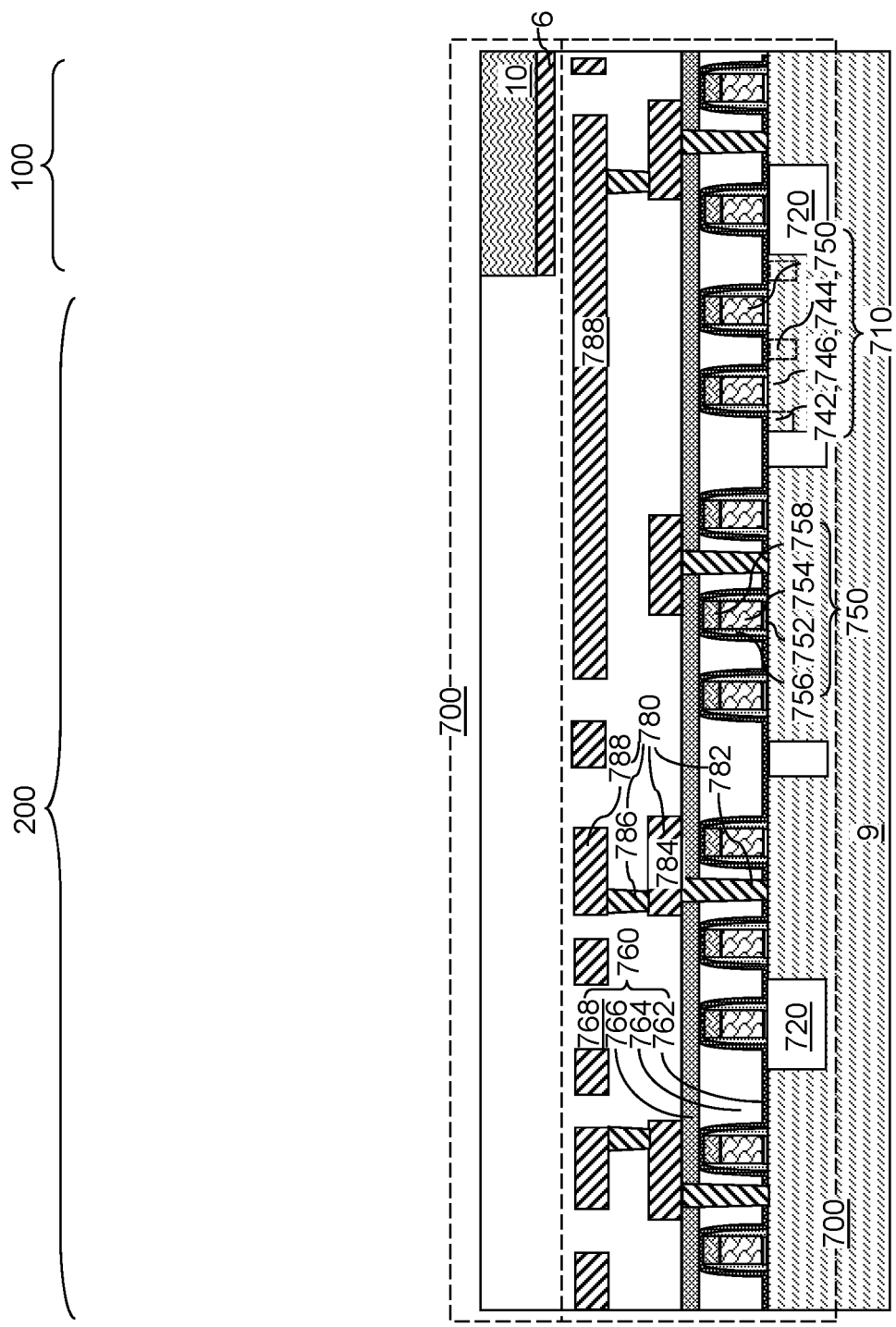
FIG. 1A is a vertical cross-sectional view of an exemplary structure after formation of semiconductor devices, at least one lower level dielectric layer, and lower level metal interconnect structures on a semiconductor substrate according to a first embodiment of the present disclosure.

Silicon nitride layers are employed as sacrificial material layers within alternating stacks of insulating layers and sacrificial material layers of a three-dimensional memory device. The present inventors realized that as the total number of sacrificial material layers increases, the vertical concentration gradient of dissolved silicon in hot phosphoric acid increases within deep backside trenches through which dissolved materials from the sacrificial material layers are transported. While a high concentration of silicon is generally helpful in maintaining selectivity of the wet etch process employing hot phosphoric acid, it is believed that a high concentration of silicon within hot phosphoric acid triggers precipitation of a silicon containing material in the lower part of the backside trenches, likely due to the silicon concentration gradient leading to a higher silicon content in the phosphoric acid in the lower part of the backside trenches. It is believed that the silicon containing material may comprise silicon, silica, silicon hydroxide $Si(OH)_4$ and/or a siloxane compound having a formula $H_2SiP_2O_8$. The silicon containing material generation from silicon nitride may occur via the following reactions: $Si_3N_4 + 12H_2O \rightarrow 3Si(OH)_4 + 4NH_3$, and $3Si(OH)_4 + 2H_3PO_4 \leftrightarrow H_2SiP_2O_8 + 4H_2O$.

The silicon containing material may accumulate on the remaining silicon oxide layers exposed in the backside trenches and clog access to the lateral recesses between the remaining silicon oxide layers. Once the access to the lateral recesses from the backside trenches is clogged, it becomes difficult or impossible to form control gate electrodes (i.e., word lines) in the lateral recesses through the backside trenches, which causes the memory device to become defective or inoperative. Thus, the present inventors realized that the range of dissolved silicon in the hot phosphoric acid should to be controlled within a desired range despite the inherent variation of silicon concentration as a function of depth within the backside trenches.

Embodiments of the present disclosure provide a method for removing the silicon nitride material of the sacrificial material layers while avoiding or reducing the silicon containing material precipitation at the bottom of the backside trenches and controlling the silicon concentration in the phosphoric acid during the wet etching. As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, any two or more measurable quantities are "substantially the same" if each of the two or more measurable quantities do not deviate from the average of the two or more measurable quantities by more than 2.5% of the average of the two or more measurable quantities. For example, a first lateral distance is substantially the same as a second lateral distance if the first lateral distance and the second lateral distance do not deviate from the average of the first lateral distance and the second lateral distance by more than 2.5% of the average of the first lateral distance and the second lateral distance.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0\times10^{-6}$ S/cm to $1.0\times10^{5}$ S/cm, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIGS. 1A and 1B, an exemplary structure according to an embodiment of the present disclosure is illustrated. The exemplary structure includes a semiconductor substrate 9, and semiconductor devices 710 formed thereupon. Shallow trench isolation structures 720 can be formed in an upper portion of the semiconductor substrate 9 to provide electrical isolation among the semiconductor devices 710. The semiconductor devices 710 can include, for example, field effect transistors including respective source regions 742, drain regions 744, channel regions 746 and gate structures 750. The field effect transistors may be arranged in a CMOS configuration. Each gate structure 750 can include, for example, a gate dielectric 752, a gate electrode 754, a gate cap dielectric 758, and a dielectric gate spacer 756. The semiconductor devices can include any semiconductor circuitry to support operation of a memory structure to be subsequently formed, which is typically referred to as driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to nodes (e.g., source 742, drain 744 or gate electrodes 750) of the semiconductor devices 710 (e.g., CMOS devices), and are located at the level of the at least one lower level dielectric layer 760.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

An optional planar conductive material layer 6 and a planar semiconductor material layer 10 can be formed over the underlying peripheral device region 700. In one embodiment, an upper portion of the at least one lower level dielectric layer 760 may be recessed in the memory array region 100, and the optional planar conductive material layer 6 and the planar semiconductor material layer 10 may be formed in the recessed region of the at least one lower level dielectric layer 760. In another embodiment, the optional planar conductive material layer 6 and the planar semiconductor material layer 10 may be deposited as planar material layers over the at least one lower level dielectric layer 760, and the portion of the optional planar conductive material layer 6 and the planar semiconductor material layer 10 may be removed from the word line contact via region 200.

The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 9 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

Figure 2A:
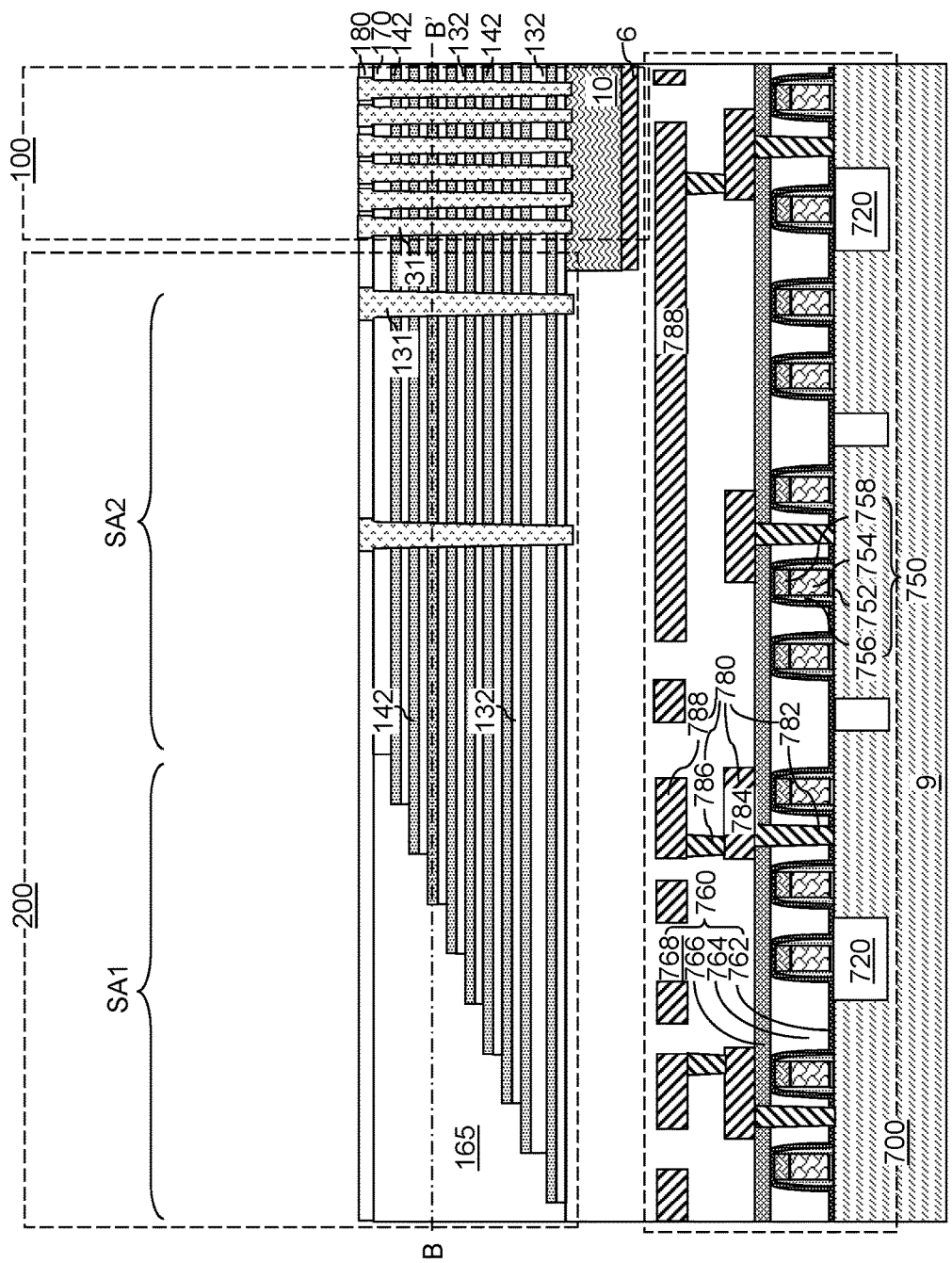
FIG. 2A is a vertical cross-sectional view of the exemplary structure after formation of a planar semiconductor material layer, a first-tier alternating stack of first insulting layers and first spacer dielectric layers, first-tier memory openings and first-tier support openings, and first-tier memory opening fill portions and first-tier sacrificial opening fill portions according to an embodiment of the present disclosure.
Figure 2B:
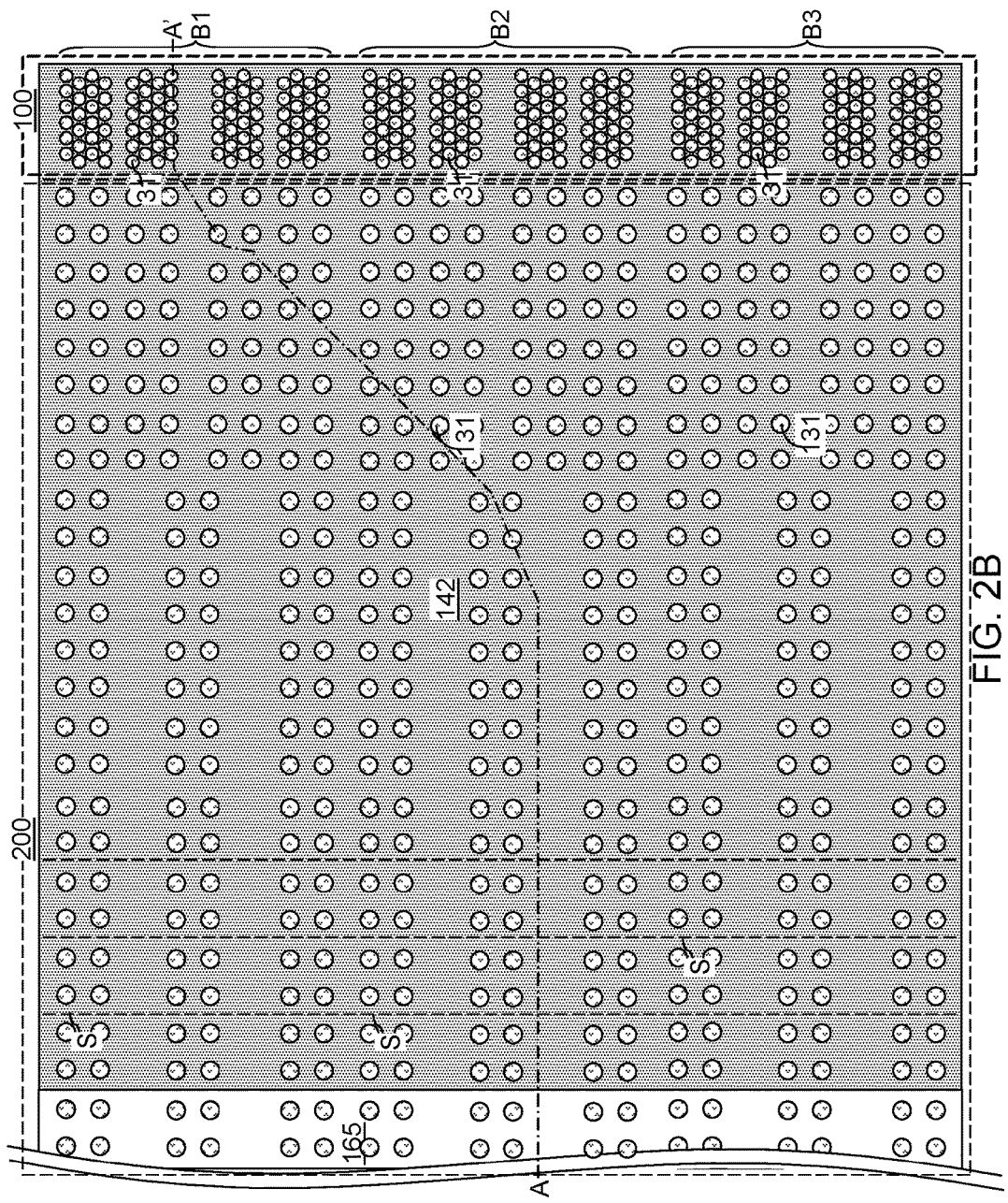
FIG. 2B is a horizontal cross-sectional view of the exemplary structure along the horizontal plane B-B' in FIG. 2A. The zig-zag vertical plane A-A' corresponds to the plane of the vertical cross-sectional view of FIG. 2A.

Referring to FIGS. 2A and 2B, at least one alternating stack of insulating layers and silicon nitride layers is formed over the planar semiconductor material layer 10 and the at least one lower level interconnect dielectric layer 768. In case at least another alternating stack of additional insulating layers and additional silicon nitride layers is subsequently formed over the alternating stack, the alternating stack contacting the planar semiconductor material layer 10 is herein referred to as a first-tier alternating stack. The level of the first-tier alternating stack is herein referred to as a first-tier level, and the level of the alternating stack to be subsequently formed immediately above the first-tier level is herein referred to as a second-tier level, etc. The first-tier alternating stack is an alternating stack of first insulting layers 132 and first silicon nitride layer 142. The first silicon nitride layers 142 are subsequently replaced with first electrically conductive layers.

The silicon nitride layers are sacrificial material layers. As used herein, a "sacrificial material" refers to a material that is removed during a subsequent processing step. As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of material layers and second material layers may begin with an instance of the material layers or with an instance of the second material layers, and may end with an instance of the material layers or with an instance of the second material layers. In one embodiment, an instance of the first elements and an instance of the second elements may form a unit that is repeated with periodicity within the alternating plurality.

The at least one alternating stack (which may be a single alternating stack or a plurality of alternating stacks) can comprises at least 108 insulating layers and at least 108 silicon nitride layers. In one embodiment, the at least one alternating stack can include a plurality of alternating stacks (for example, a first-tier alternating stack, a second-tier alternating stack, and optionally one or more additional-tier alternating stacks) such that the total number of insulating layers in the at least one alternating stack is at least 108, and the total number of silicon nitride layers within the alternating stack is at least 108. In this case, a lower portion of the plurality of alternating stacks can include the first-tier alternating stack, and an upper portion of the plurality of alternating stacks can include a topmost-tier alternating stack (which can be the second-tier alternating stack in a stack of two alternating stacks). Alternatively, the at least one alternating stack can include a single alternating stack including at least 108 insulating layers and at least 108 silicon nitride layers.

The first-tier alternating stack (132, 142) can include first insulating layers 132 composed of an insulating material, and first silicon nitride layers 142 composed of silicon nitride. The first insulating layers 132 include an insulating material, such that that silicon nitride can be removed selective to the insulating material. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. Insulating materials that can be employed for the first insulating layers 132 include, but are not limited to silicon oxide (including doped or undoped silicate glass), silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The first silicon nitride layers 142 can be formed, for example, CVD or atomic layer deposition (ALD).

The thicknesses of the first insulating layers 132 and the first silicon nitride layers 142 can be in a range from 15 nm to 40 nm, although lesser and greater thicknesses can be employed for each first insulating layer 132 and for each first silicon nitride layer 142. The number of repetitions of the pairs of a first insulating layer 132 and a first silicon nitride layer 142 can be in a range from 64 to 1,024, although a greater number of repetitions can also be employed. In one embodiment, each first silicon nitride layer 142 in the first-tier alternating stack (132, 142) can have a uniform thickness that is substantially invariant within each respective first silicon nitride layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

The first insulating cap layer 170 and the first-tier alternating stack (132, 142) can be patterned to form first stepped surfaces in each word line contact via region 200. Each of the word line contact via regions 200 can include a respective first stepped area SA1 in which the first stepped surfaces are formed, and a second stepped area SA2 in which additional stepped surfaces are to be subsequently formed in a second tier structure (to be subsequently formed over a first tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first silicon nitride layer 142 located directly underneath the bottom surface of the etched cavity within the etched area.

A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first tier structure, which is an in-process structure that is subsequently modified. Optionally, an inter-tier dielectric material layer 180 may be deposited over the first tier structure (132, 142, 165, 170). The inter-tier dielectric material layer 180 includes a dielectric material such as silicon oxide. The thickness of the inter-tier dielectric material layer 180 can be in a range from 30 nm to 300 nm, although lesser and greater thicknesses can also be employed.

Openings can be formed through the optional inter-tier dielectric material layer 180 and the first tier structure (132, 142, 165, 170). The openings can include first-tier memory openings that are formed in the memory array region 100, and first-tier support openings that are formed in the word line contact via regions 200. The first-tier memory openings extend to a top surface of the planar semiconductor material layer 10. The first-tier support openings can extend onto, and optionally into, the at least one lower level dielectric layer 760.

The first-tier memory openings can be formed in the memory array region 100 at locations at which memory stack structures including vertical stacks of memory elements are to be subsequently formed, and the first-tier support openings can be formed in the word line contact via regions 200. For example, a lithographic material stack (not shown) including at least a photoresist layer can be formed over the inter-tier dielectric material layer 180, and can be lithographically patterned to form openings within the lithographic material stack. The pattern in the lithographic material stack can be transferred through the inter-tier dielectric material layer 180, the first insulating cap layer 170, and through the entirety of the first-tier alternating stack (132, 142) by at least one anisotropic etch that employs the patterned lithographic material stack as an etch mask. Portions of the inter-tier dielectric material layer 180, the first insulating cap layer 170, and the first-tier alternating stack (132, 142) underlying the openings in the patterned lithographic material stack are etched to form the first-tier memory openings and the first-tier support openings. In other words, the transfer of the pattern in the patterned lithographic material stack through the first insulating cap layer 170 and the first-tier alternating stack (132, 142) forms the first-tier memory openings and the first-tier support openings.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches. The sidewalls of the first-tier memory openings can be substantially vertical, or can be tapered. Subsequently, the patterned lithographic material stack can be subsequently removed, for example, by ashing. Optionally, the portions of the first-tier memory openings at the level of the inter-tier dielectric material layer 180 can be laterally expanded by an isotropic etch. For example, if the inter-tier dielectric material layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric material layer 180. In this case, portions of the first-tier memory openings and the first-tier support openings located at the level of the inter-tier dielectric material layer 180 may be optionally widened to provide a larger landing pad for second-tier memory openings and second via openings to be subsequently formed through a second-tier alternating stack (to be subsequently formed prior to formation of the second-tier memory openings).

A sacrificial fill material can be deposited in each of the first-tier memory openings and the first-tier support openings. The sacrificial fill material layer includes a sacrificial material which can be subsequently removed selective to the materials of the first insulating layers 132 and the first silicon nitride layers 142. Optionally, a thin dielectric liner such as a silicon oxide liner (not shown) having a thickness in a range from 1 nm to 6 nm may be formed to facilitate subsequent selective removal of the sacrificial fill material. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In one embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the inter-tier dielectric material layer 180. For example, the sacrificial fill material layer can be recessed to a top surface of the inter-tier dielectric material layer 180 employing a planarization process. The planarization process can include a recess etch, chemical mechanical planarization (CMP), or a combination thereof. The top surface of the inter-tier dielectric material layer 180 can be employed as an etch stop layer or a planarization stop layer. Each remaining portion of the sacrificial material in a first-tier memory opening constitutes a sacrificial memory opening fill portion 31. Each remaining portion of the sacrificial material in a first-tier support opening constitutes a sacrificial via fill portion 131. The top surfaces of the sacrificial memory opening fill portions 31 and the sacrificial via fill portions 131 can be coplanar with the top surface of the inter-tier dielectric material layer 180. The sacrificial memory opening fill portion 31 and/or the sacrificial via fill portions 131 may, or may not, include cavities therein.

Figure 3A:
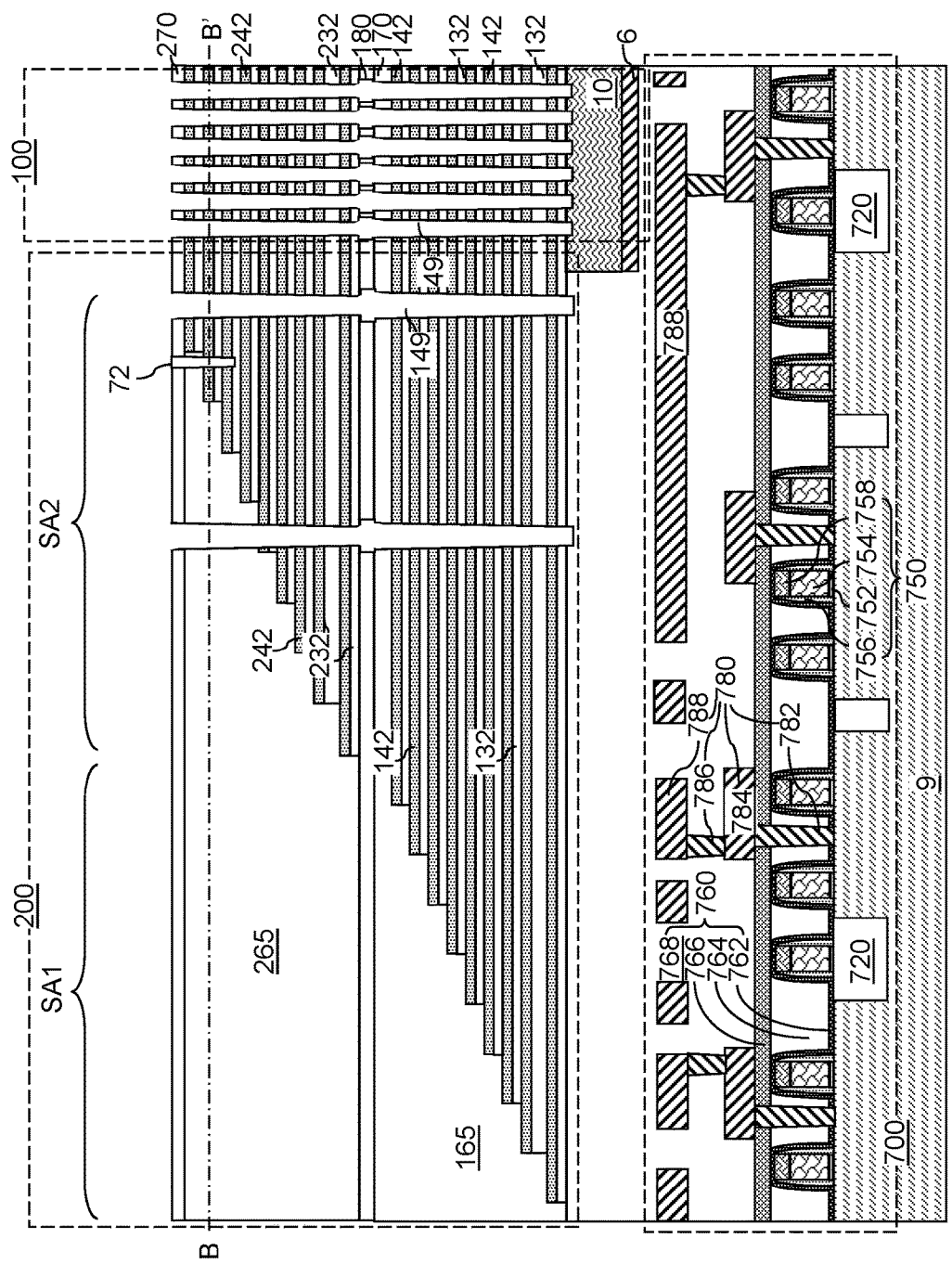
FIG. 3A is a vertical cross-sectional view of the exemplary structure after formation of a second-tier alternating stack of second insulating layers and second spacer dielectric layers, second-tier memory openings and second-tier support openings, and removal of the first-tier memory opening fill portions and the first-tier sacrificial opening fill portions according to an embodiment of the present disclosure.
Figure 3B:
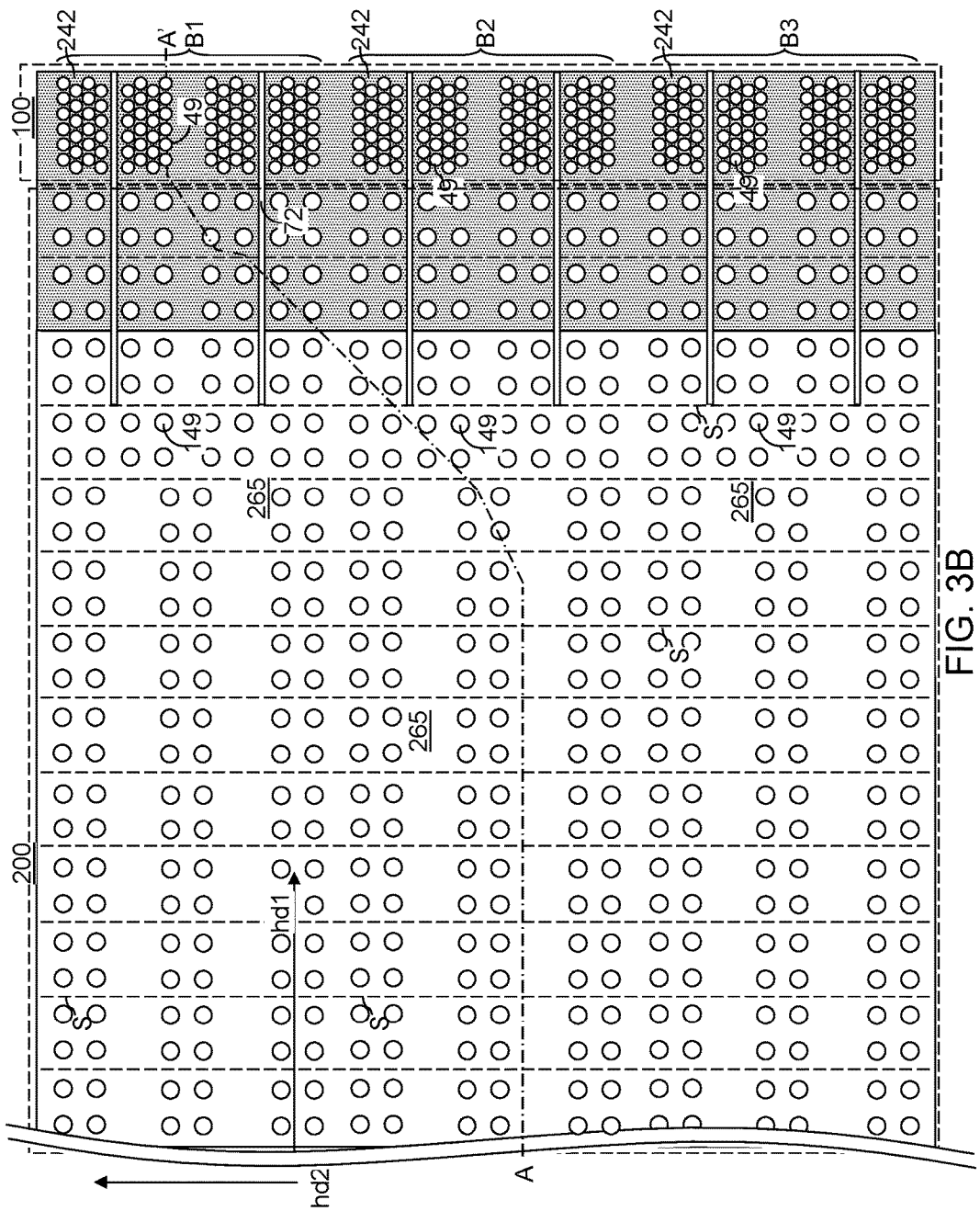
FIG. 3B is a horizontal cross-sectional view of the exemplary structure along the horizontal plane B-B' in FIG. 3A. The zig-zag vertical plane A-A' corresponds to the plane of the vertical cross-sectional view of FIG. 3A.

Referring to FIGS. 3A and 3B, a second tier structure can be formed over the first tier structure (132, 142, 165, 170, 31, 131). The second tier structure can include an additional alternating stack of insulating layers and silicon nitride layers (which are sacrificial material layers). For example, a second alternating stack (232, 242) including second insulating layers 232 and second silicon nitride layers 242 can be subsequently formed over the first alternating stack (132, 142). In one embodiment, the second insulating layers 232 can include the same material as the first insulating layer 132, and the second silicon nitride layers 242 include silicon nitride. The second silicon nitride layers 242 can be subsequently replaced with electrically conductive electrodes which can function, for example, as control gate electrodes of a vertical NAND device.

The thicknesses of the second insulating layers 232 and the second silicon nitride layers 242 can be in a range from 15 nm to 40 nm, although lesser and greater thicknesses can be employed for each second insulating layer 232 and for each second silicon nitride layer 242. The number of repetitions of the pairs of a second insulating layer 232 and a second silicon nitride layer 242 can be in a range from 64 to 1,024, and typically from 64 to 256, although a greater number of repetitions can also be employed. In one embodiment, each second silicon nitride layer 242 in the second stack (232, 242) can have a uniform thickness that is substantially invariant within each respective second silicon nitride layer 242.

Second stepped surfaces in the second stepped area SA2 can be formed in the word line contact via regions 200 employing a same set of processing steps as the processing steps employed to form the first stepped surfaces in the first stepped area SA1 with suitable adjustment to the pattern of at least one masking layer. A second-tier retro-stepped dielectric material portion 265 can be formed over the word line contact via regions 200. Generally, at least one retro-stepped dielectric material portion (165, 265) can be formed over the staircase regions on the at least one alternating stack (132, 142, 232, 242).

A second insulating cap layer 270 can be subsequently formed over the second alternating stack (232, 242). The second insulating cap layer 270 includes a dielectric material that is different from the material of the second silicon nitride layers 242. In one embodiment, the second insulating cap layer 270 can include silicon oxide.

Optionally, drain-select-level shallow trench isolation structures 72 can be formed through a subset of layers in an upper portion of the second-tier alternating stack (232, 242). The second silicon nitride layers 242 that are cut by the drain-select-level shallow trench isolation structures 72 correspond to the levels in which drain-select-level electrically conductive layers are subsequently formed. The drain-select-level shallow trench isolation structures 72 extend along the first horizontal direction hd1 and divide blocks (B1, B2, B3, . . . ) into multiple sub-blocks in the second horizontal direction hd2. The drain-select-level shallow trench isolation structures 72 include a dielectric material such as silicon oxide. Locations of steps S in the first-tier alternating stack (132, 142) and the second-tier alternating stack (232, 242) are illustrated in FIG. 3B as dashed lines.

Openings can be formed through the second tier structure (232, 242, 265, 270). The openings can include second-tier memory openings that overlie the sacrificial memory opening fill portions 31, and second-tier support openings that overlie the sacrificial via fill portions 131. For example, a photoresist layer can be applied over the second tier structure (232, 242, 265, 270), and can be lithographically patterned to form a same pattern as the pattern of the sacrificial memory opening fill portions 31 and the sacrificial via fill portions 131. The lithographic mask employed to pattern the first-tier memory openings and first-tier support openings can be employed to pattern the second-tier memory openings and the second tier support openings. An anisotropic etch can be performed to transfer the pattern of the lithographically patterned photoresist layer through the second tier structure (232, 242, 265, 270). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 31 can be physically exposed at the bottom of each second-tier memory opening. A top surface of an underlying sacrificial via fill portion 131 can be physically exposed at the bottom of each second-tier support opening. After the top surfaces of the sacrificial memory opening fill portions 31 and sacrificial via fill portions 131 are physically exposed, an etch process can be performed, which removes the sacrificial material of the sacrificial memory opening fill portions 31 and the sacrificial via fill portions 131 selective to the materials of the second-tier alternating stack (232, 242) and the first-tier alternating stack (132, 142).

Upon removal of the sacrificial memory opening fill portions 31, each vertically adjoining pair of a second-tier memory opening and a first-tier memory opening forms a continuous cavity that extends through the first-tier alternating stack (132, 142) and the second-tier alternating stack (232, 242). The continuous cavities are herein referred to as memory openings 49. A top surface of the planar semiconductor material layer 10 can be physically exposed at the bottom of each memory opening 49.

Upon removal of the sacrificial via fill portions 131, each vertically adjoining pair of a second-tier support opening and a first-tier support opening forms an additional continuous cavity that extends through the first-tier alternating stack (132, 142) and the second-tier alternating stack (232, 242). The additional continuous cavities are herein referred to as support openings 149. A top surface of the at least one lower level dielectric layer 760 can be physically exposed at the bottom of each support opening 149.

Figure 4A:
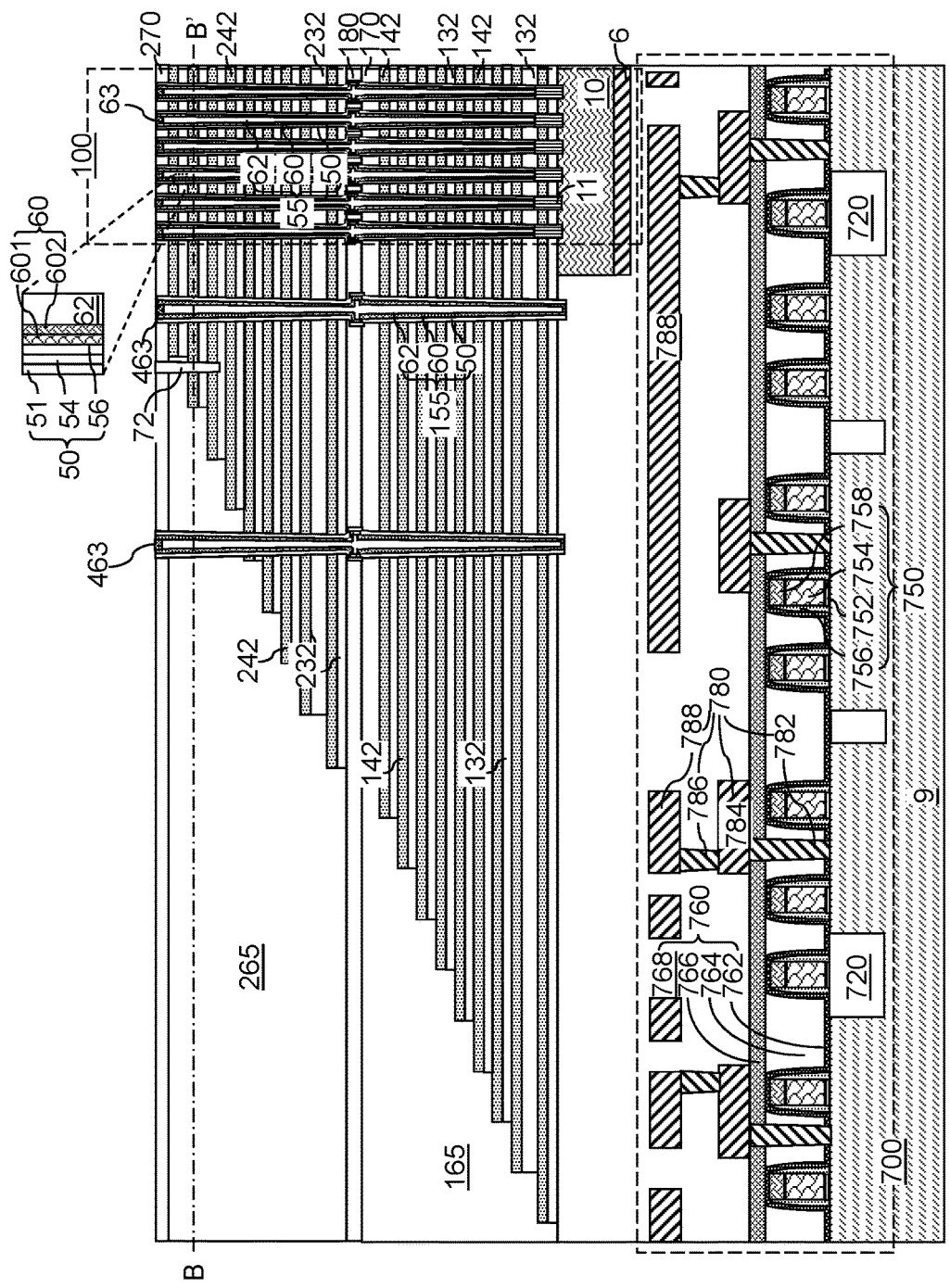
FIG. 4A is a vertical cross-sectional view of the exemplary structure after formation of memory stack structures and support pillar structures according to an embodiment of the present disclosure.
Figure 4B:
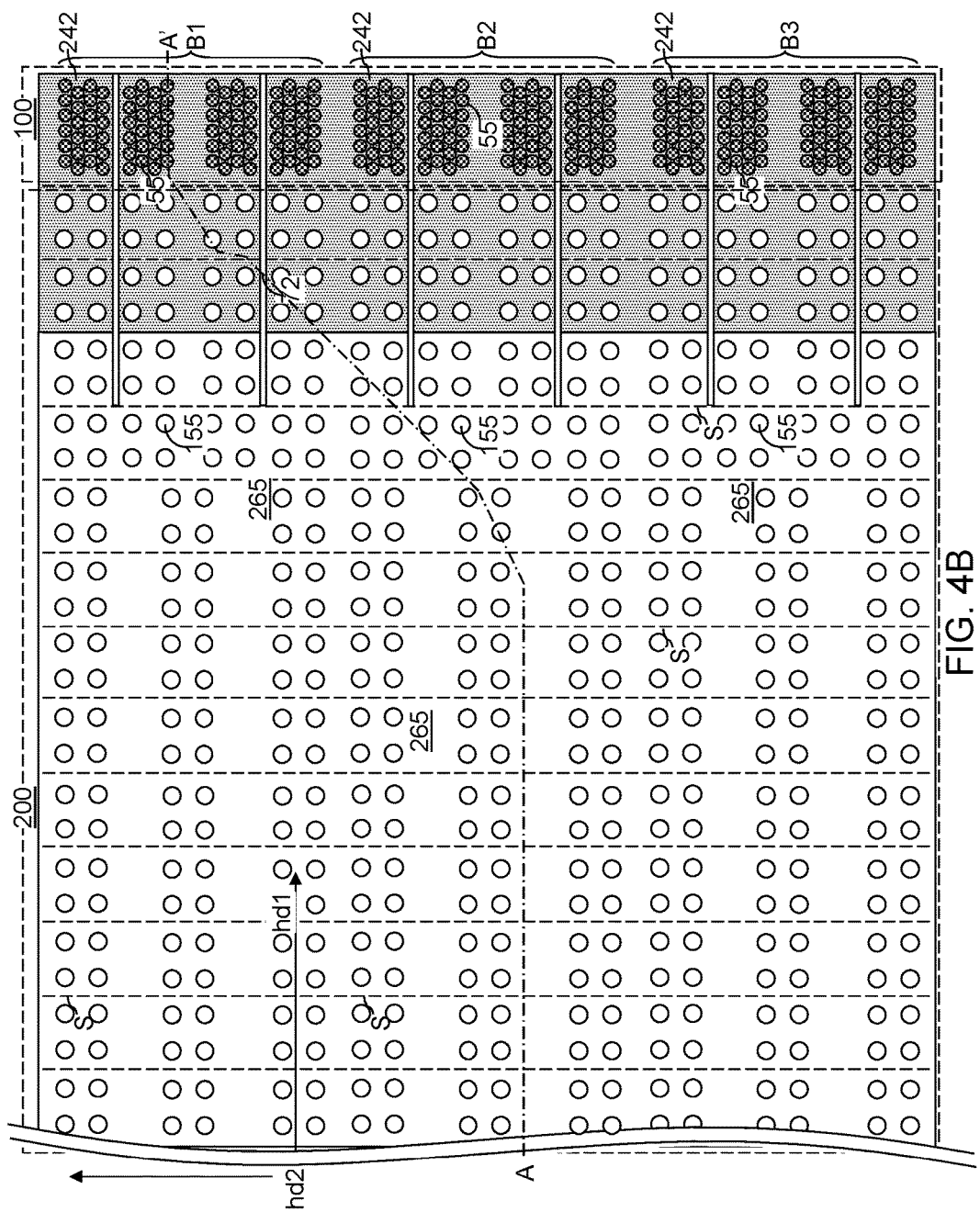
FIG. 4B is a horizontal cross-sectional view of the exemplary structure along the horizontal plane B-B' in FIG. 4A. The zig-zag vertical plane A-A' corresponds to the plane of the vertical cross-sectional view of FIG. 4A.
Figure 5A:
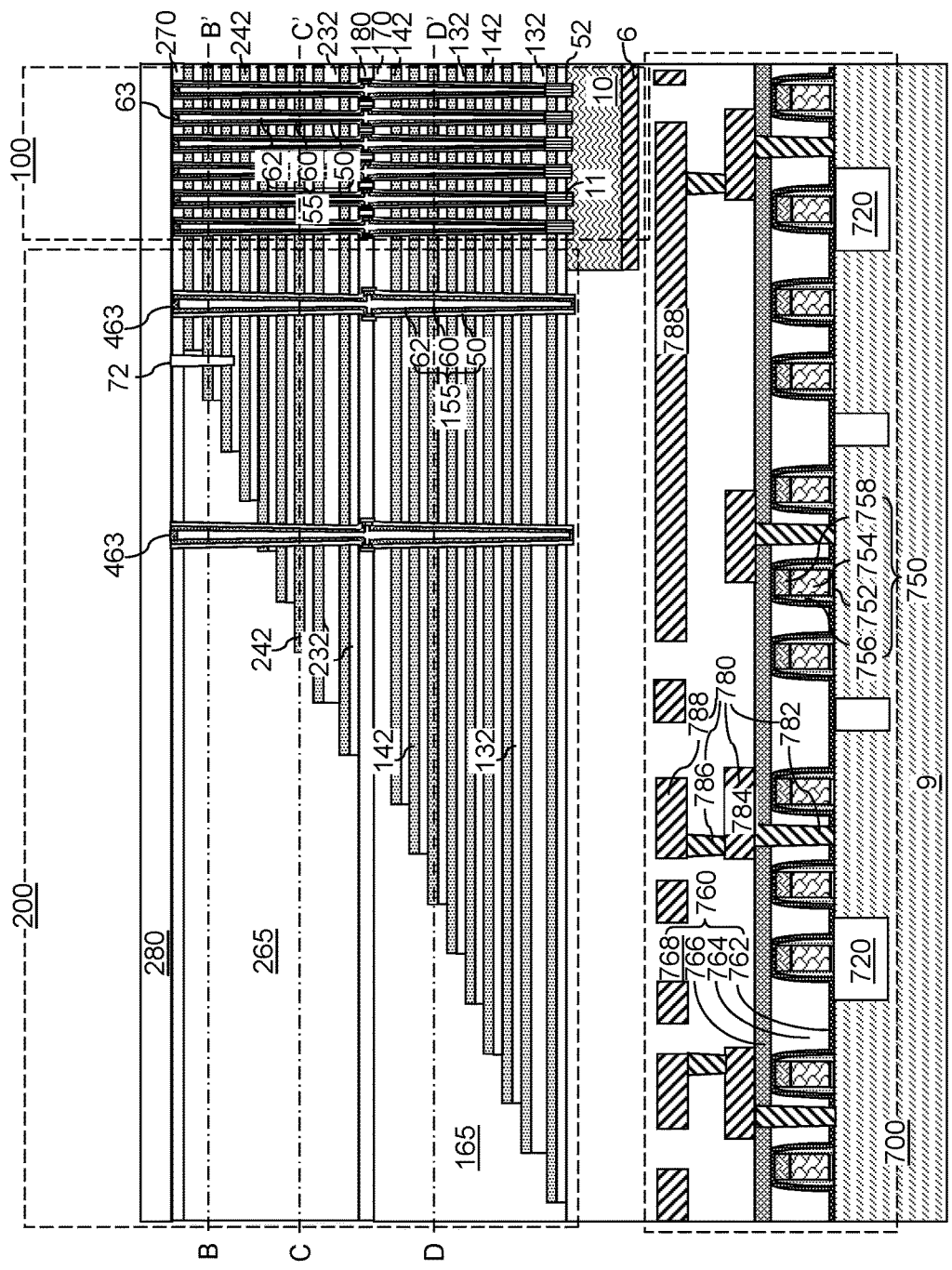
FIG. 5A is a vertical cross-sectional view of the exemplary structure after formation of drain-select-level shallow trench isolation structures and a contact level dielectric layer according to an embodiment of the present disclosure.
Figure 5B:
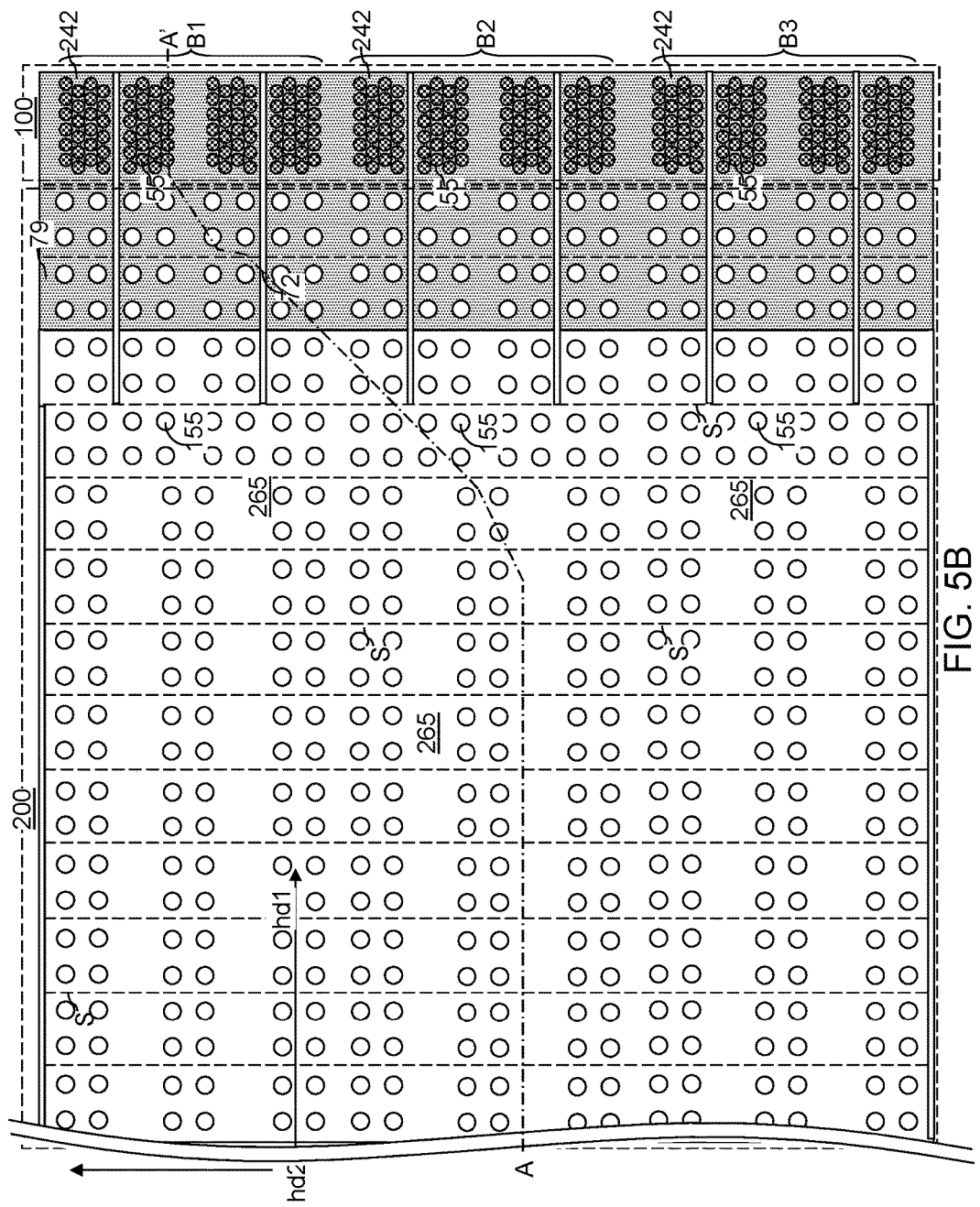
FIG. 5B is a horizontal cross-sectional view of the exemplary structure along the horizontal plane B-B' in FIG. 5A. The zig-zag vertical plane A-A' corresponds to the plane of the vertical cross-sectional view of FIG. 5A.
Figure 5C:
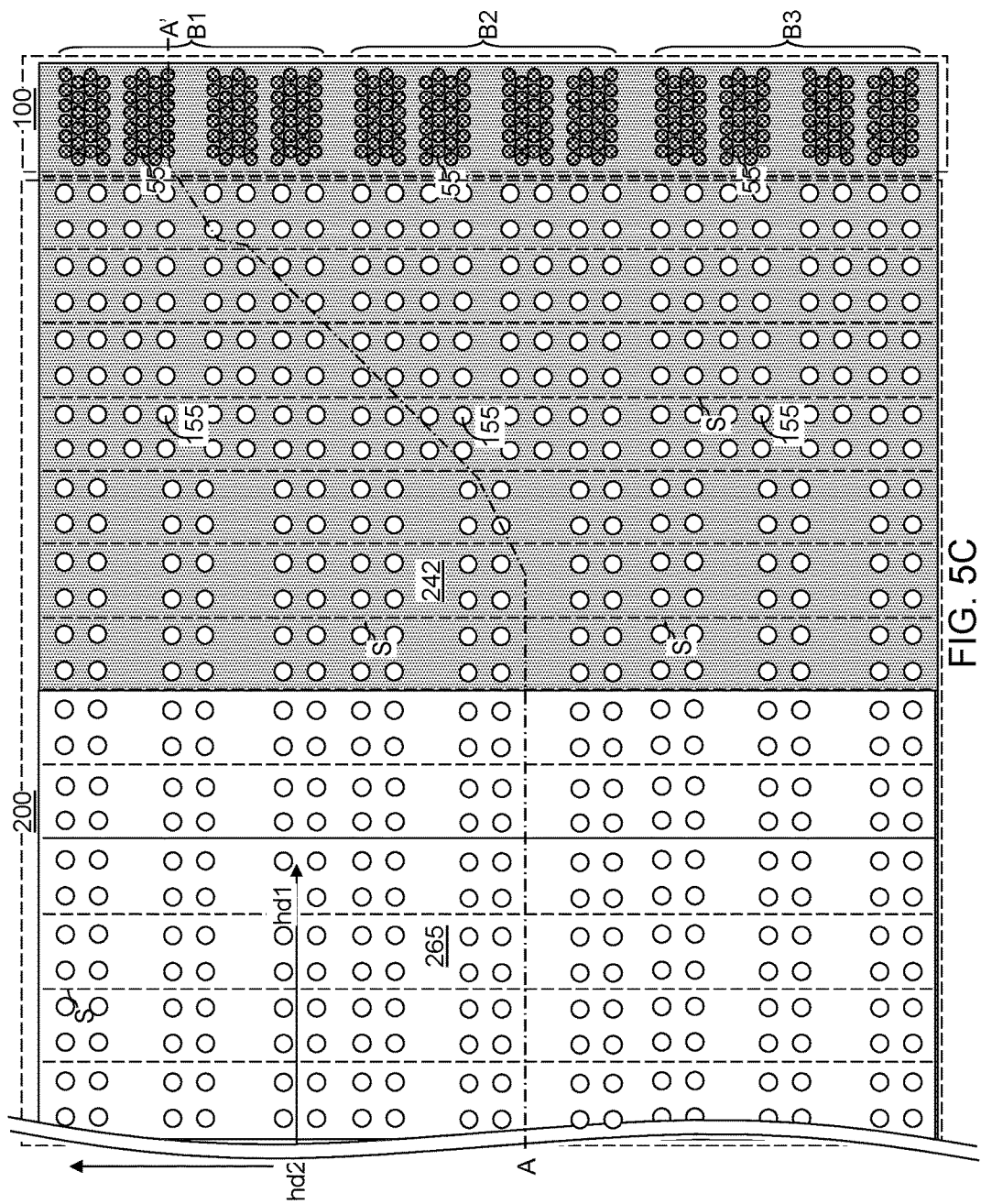
FIG. 5C is a horizontal cross-sectional view of the exemplary structure along the horizontal plane C-C' in FIG. 5A.
Figure 5D:
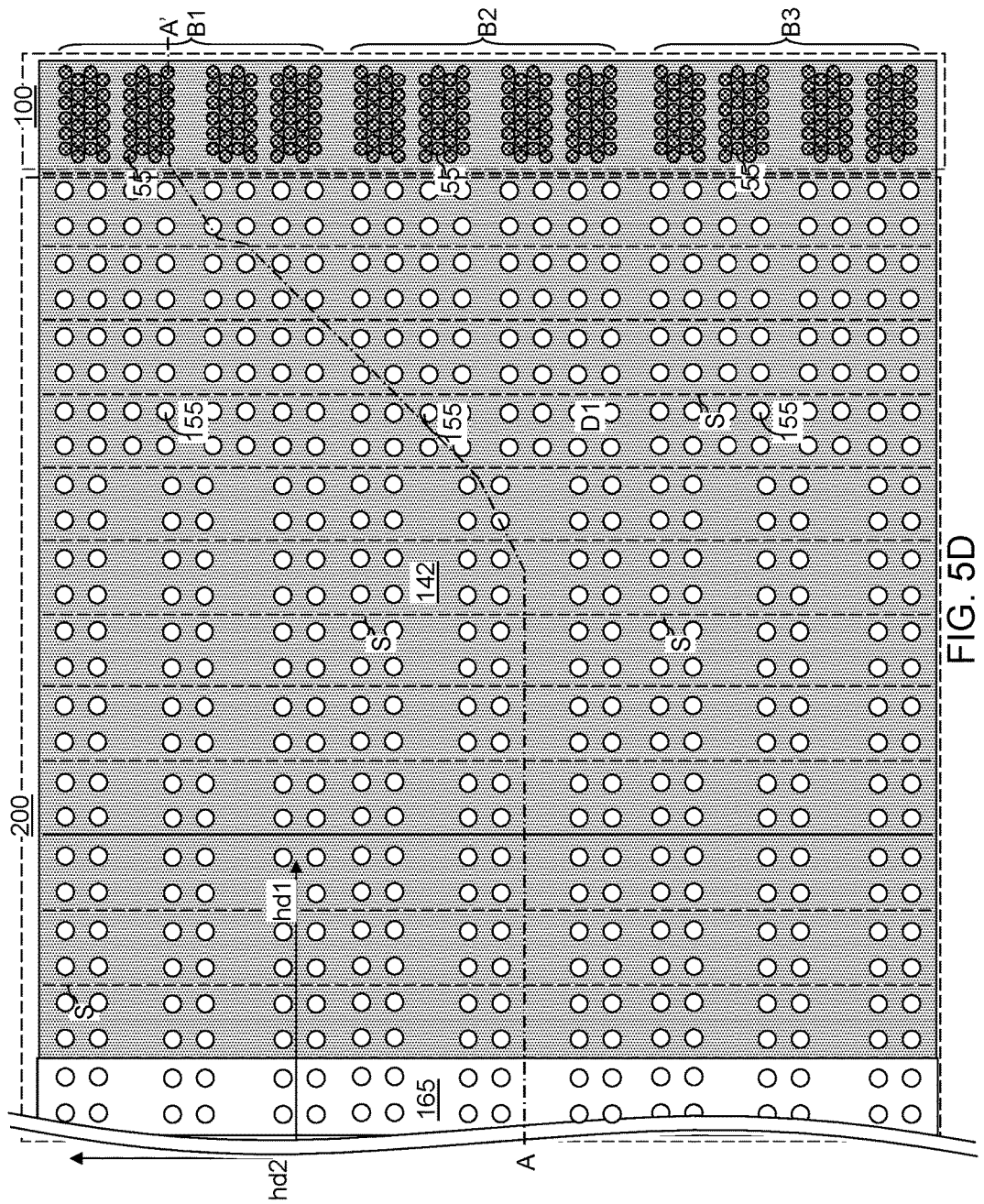
FIG. 5D is a horizontal cross-sectional view of the exemplary structure along the horizontal plane D-D' in FIG. 5A.

Referring to FIGS. 4A and 4B, pedestal channel portions 11 can be optionally formed at the bottom of each memory opening 49 by a selective semiconductor deposition process. The selective semiconductor deposition grows a semiconductor material only from semiconductor surfaces, i.e., the physically exposed surfaces of the planar semiconductor material layer 10, and suppresses growth of the semiconductor material from insulator surfaces. During a selective semiconductor deposition process, a reactant (such as silane, dichlorosilane, trichlorosilane, disilane, etc.) can be flowed into a deposition chamber simultaneously with, or alternately with, an etchant (such as hydrogen chloride). Because a semiconductor material is deposited at a greater deposition rate on semiconductor surfaces than on insulator surfaces, a selective growth can be achieved by setting the etch rate between the deposition rate of the semiconductor material on semiconductor surfaces and the deposition rate of the semiconductor material on insulator surfaces. In one embodiment, the top surfaces of the pedestal channel portions 11 can extend above source select levels in which source-select-level electrically conductive layers can be subsequently formed. Because semiconductor surfaces are not physically exposed in the support openings 149, the semiconductor material is not deposited within the support openings 149.

Memory stack structures 55 and support pillar structures 155 can be formed in the memory openings 49 and in the support openings 149, respectively, during the same deposition steps. In an illustrative example, each memory stack structure 55 and each support pillar structure 155 can include a memory film 50, a vertical semiconductor channel 60, and an optional dielectric core 62. In one embodiment, each memory film 50 can include a blocking dielectric layer 51, a memory material layer 54, and a tunneling dielectric layer 56 as illustrated in the inset. In one embodiment, each vertical semiconductor channel 60 can include a first semiconductor channel 601 and a second semiconductor channel 602.

The blocking dielectric layer 51 includes a blocking dielectric layer material such as silicon oxide, a dielectric metal oxide (such as aluminum oxide), or a combination thereof. Alternatively, the blocking dielectric layer 51 may be omitted during this processing step and instead be formed through lateral recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each portion of the memory material layer 54 that is located at the levels of the sacrificial material layers (142, 242) that will be subsequently replaced with electrically conductive layers (e.g., word lines) functions as a charge storage region of a memory cell of the memory device.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

A first semiconductor channel layer can be deposited over the memory films 50 by a conformal deposition method such as low pressure chemical vapor deposition (LPCVD). The thickness of the first semiconductor channel layer can be in a range from 2 nm to 10 nm, although lesser and greater thicknesses can also be employed. The first semiconductor channel layer and the memory films 50 can be anisotropically etched to remove horizontal portions thereof. A horizontal bottom portion of each memory film 50 can be removed from the bottom of each memory opening. Each remaining portion of the first semiconductor channel layer constitutes a first semiconductor channel 601. The first semiconductor channels can include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channels 601 can include amorphous silicon or polysilicon.

A second semiconductor channel layer can be deposited on the first semiconductor channels 601 (i.e., the remaining vertical portions of the first semiconductor channel layer) and on top surface of the epitaxial channel portions 11 (or of the substrate semiconductor layer 10 in case the epitaxial channel portions 11 are not present). The second semiconductor channel layer includes a semiconductor material, which can be any semiconductor material that can be employed for the first semiconductor channel layer. The first and second semiconductor channel layers can have a doping of the first conductivity type (i.e., the same conductivity type as the substrate semiconductor layer 10) or can be substantially intrinsic, i.e., having a dopant concentration that does not exceed $1.0\times10^{17}/cm^3$. In one embodiment, the second semiconductor channel layer can include amorphous silicon or polysilicon. The thickness of the second semiconductor channel layer can be in a range from 2 nm to 10 nm, although lesser and greater thicknesses can also be employed.

A dielectric material can be deposited in cavities surrounded by the second semiconductor channel layer, and subsequently recessed below the top surface of the second insulating cap layer 270. Each remaining portion of the dielectric material in the memory openings constitutes a dielectric core 62. A doped semiconductor material having a second conductivity type (which is the opposite of the first conductivity type) can be deposited over the dielectric cores 62. Each portion of the doped semiconductor material deposited within the cavities in the memory openings forms a drain region 63. Each portion of the doped semiconductor material deposited within the cavities in the support openings forms a dummy drain region 463. The doped semiconductor material can be, for example, doped polysilicon. Excess portions of the deposited semiconductor material can be removed from above the top surface of the second insulating tier cap layer 270, for example, by chemical mechanical planarization (CMP) or a recess etch to form the drain region 63 and the dummy drain regions 63. Each remaining portion of the second semiconductor channel layer constitutes a second semiconductor channel 602.

A combination of a first semiconductor channel 601 and a second semiconductor channel 602 inside a memory opening constitutes a vertical semiconductor channel 60. Each of the memory stack structures 55 comprises a memory film 50 and a vertical semiconductor channel 60 that is adjoined to a respective horizontal channel within the planar semiconductor material layer 10. Each memory film 50 can include a blocking dielectric layer 51 contacting a sidewall of the memory opening, a plurality of charge storage regions (embodied as portions of a memory material layer 54 at each level of the sacrificial material layers (142, 242)) located on an inner sidewall of the blocking dielectric layer 51, and a tunneling dielectric layer 56 located inside the plurality of charge storage regions.

The first tier structure (132, 142, 170, 165), the second tier structure (232, 242, 270, 265), the inter-tier dielectric material layer 180, and the memory stack structures 55 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Referring to FIGS. 5A-5D, a contact level dielectric layer 280 can be formed over the memory-level assembly. The contact level dielectric layer 280 is formed at a contact level through which various contact via structures are subsequently formed to the drain regions 63 and to the various electrically conductive layers that are subsequently formed by replacing the sacrificial material layers (142, 242).

Figure 6A:
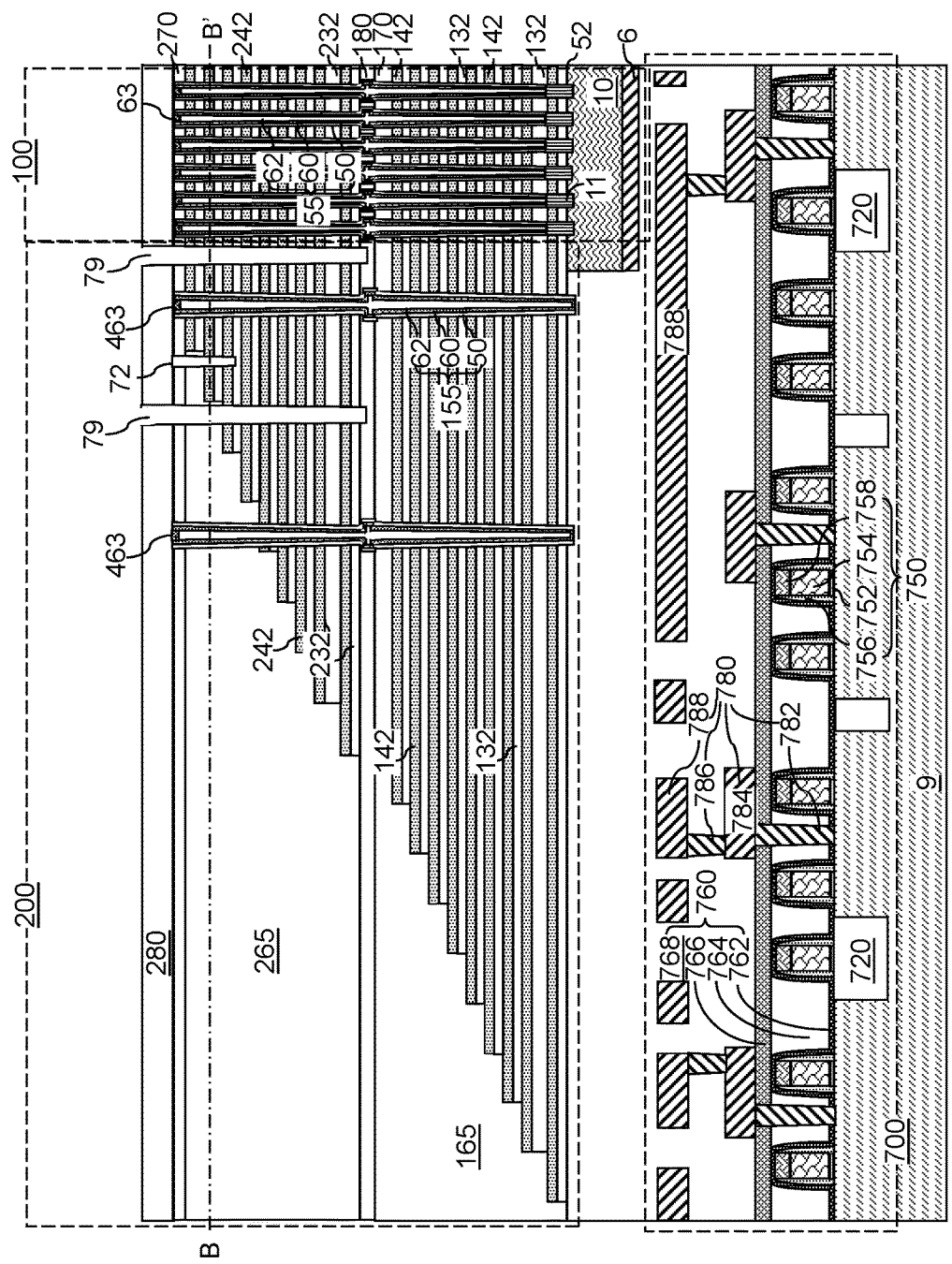
FIG. 6A is a vertical cross-sectional view of the exemplary structure after formation of backside trenches through the second tier structure according to an embodiment of the present disclosure.
Figure 6C:
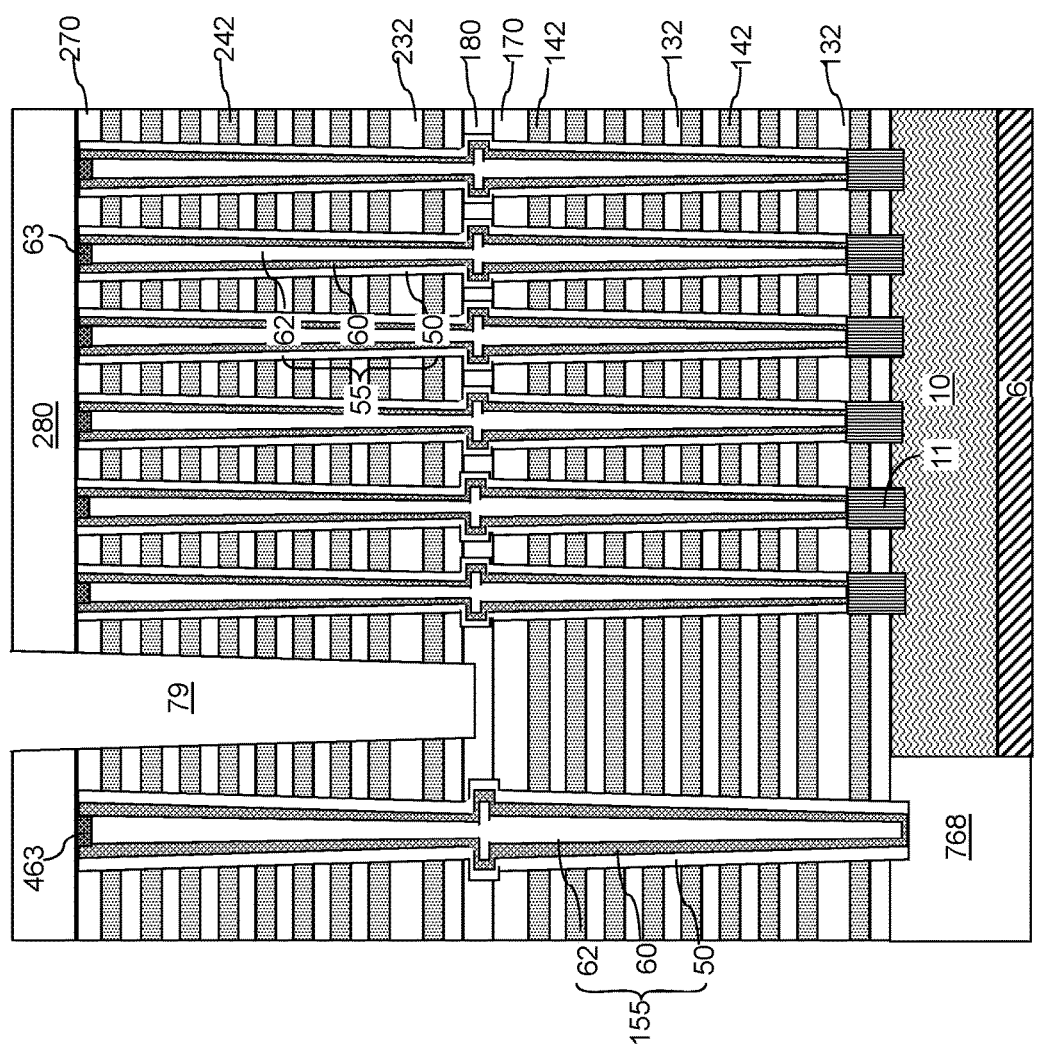
FIG. 6C is a magnified view of an array region of the exemplary structure of FIG. 6A.

Referring to FIGS. 6A-6C, trenches are subsequently formed through the contact level dielectric layer 280 and the second alternating stack (232, 242). The trenches are formed in areas offset from the memory stack structures 55 and support pillar structures 155 for the purpose of subsequently forming contact structures therein, and thus, are herein referred to as backside trenches 79. For example, a photoresist layer can be applied an lithographically patterned over the contact level dielectric layer 280 to form elongated openings that extend along the first horizontal direction hd1 A subset of the openings in the patterned photoresist layer fall on the boundaries between blocks (B1, B2, B3, . . . ).

An anisotropic etch is performed to transfer the pattern in the patterned photoresist layer through the contact level dielectric layer 280 and through an upper portion of the at least one alternating stack in the memory-level assembly. For example, if the memory-level assembly includes the second-tier alternating stack (232, 242) and the first-tier alternating stack (132, 142), the pattern in the photoresist layer can be transferred through the contact level dielectric layer 280 and the second-tier alternating stack (232, 242). The inter-tier dielectric material layer 180 can be employed as an etch stop layer during formation of the backside trenches through the second-tier alternating stack (232, 242), which is an upper portion of the at least one alternating stack. In one embodiment, the inter-tier dielectric material layer 180 can have a greater thickness than any of the first and second insulating layers (132, 232) that are present within first alternating stack (132, 142) and the second alternating stack (232, 242). In an embodiment in which the at least one alternating stack consists of a single alternating stack, the upper portion of the at least one alternating stack through which the backside trenches 79 are formed can include a set of upper layers within the single alternating stack, such as the set of upper half of the layers of the single alternating stack. The photoresist layer can be subsequently removed, for example, by ashing.

The backside trenches 79 extend along the first horizontal direction hd1, and thus, are elongated along the first horizontal direction hd1. The backside trenches 79 include a first subset 79A of backside trenches 79 that laterally extend through a memory array region 100 and through the word line contact via regions 200. Each block (B1, B2, B3, . . . ) includes a respective portion of the memory array region between a neighboring pair of backside trenches 79 among the first subset 79A of the backside trenches 79. Each block (B1, B2, B3, . . . ) can include the respective portion of the memory array region 100 and a staircase region located on one or both lengthwise ends of the respective portion of the memory array region 100 and including a word line contact via region 200.

Optionally, a second subset 79B of backside trenches 79 may be provided within each block (B1, B2, B3, . . . ). If employed, the second subset 79B of backside trenches 79 can laterally extend along the first horizontal direction hd1, and can be positioned to suitably divide each block into a plurality of sub-blocks. If the drain-select-level shallow trench isolation structures 72 are employed, the drain-select-level shallow trench isolation structures 72 can extend along the first horizontal direction hd1 to divide a subset of layers in an upper portion of the second-tier alternating stack (232, 242) within each sub-block or within each block. Various design optimizations can be employed to divide a block into sub-blocks or subordinate units.

Optionally, a third subset 79C of the backside trenches 79 can be provided in the word line contact via regions 200. In one embodiment, the third subset 79C of the backside trenches 79 may be laterally offset from the first and second subsets 79A and 79B of backside trenches 79 in at least one, and preferably both, of the first and the second horizontal directions (hd1, hd2). This configuration of trenches 79 may reduce the stress on the substrate 9.

Sidewalls of the second insulating layers 232 and the second silicon nitride layers 242 are physically exposed within each backside trench 79. Further, a surface of the inter-tier dielectric material layer 180 can be physically exposed within each backside trench 79. Alternatively, in case an inter-tier dielectric material layer 180 is not employed, a surface of the first insulating cap layer 170 or a surface of an insulating layer or a silicon nitride layer within a single alternating stack of the memory-level assembly may be physically exposed.

Figure 7:
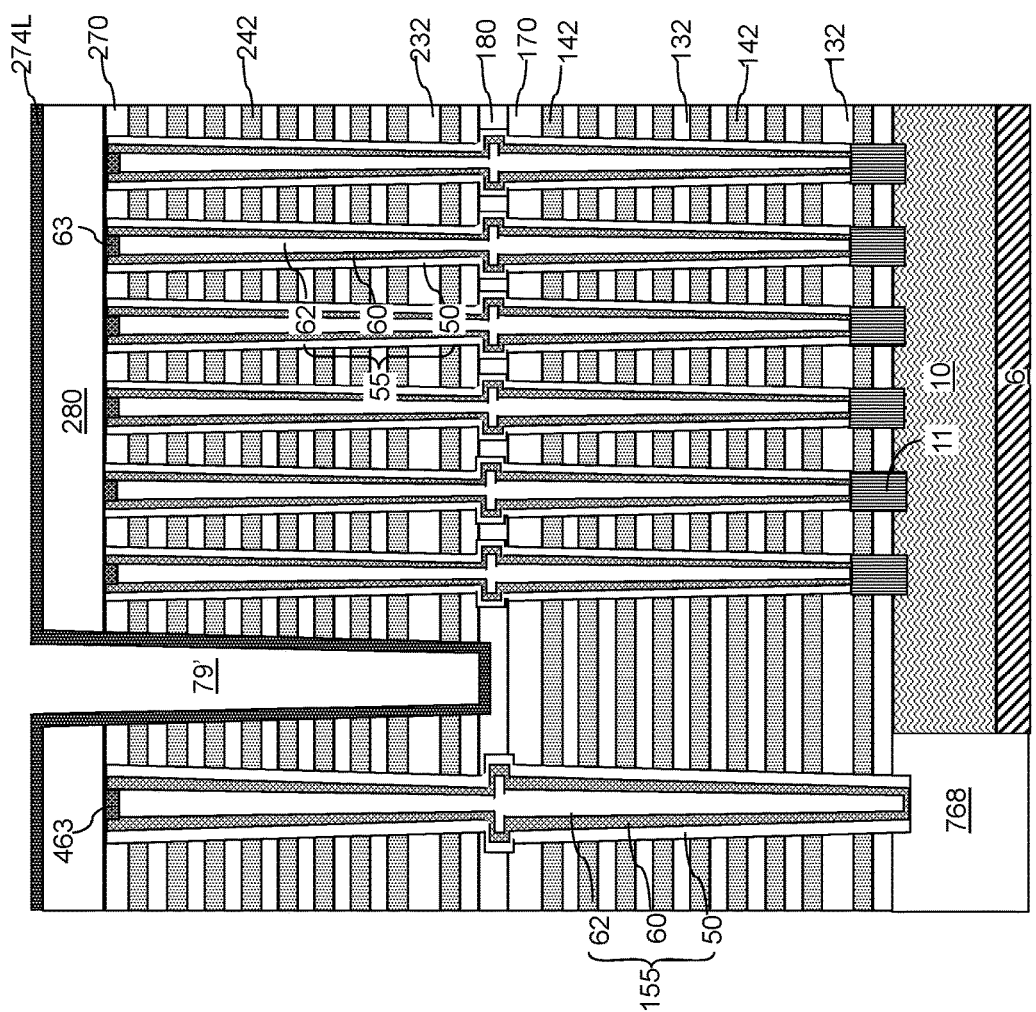
FIG. 7 is a magnified view of the array region after formation of an etch mask layer according to an embodiment of the present disclosure.

Referring to FIG. 7, an etch mask material layer 274L can be deposited on the physically exposed surfaces of the backside trenches 79 and over the contact level dielectric layer 280 by a conformal deposition process such as chemical vapor deposition (CVD). The etch mask material layer 274L includes a material that is resistant to hot phosphoric acid, and can be removed selective to the materials of the first insulating layers 132, the first insulating cap layer 170, and the inter-tier dielectric material layer 180. In one embodiment, the first insulating layers 132, the first insulating cap layer 170, and the inter-tier dielectric material layer 180 can include silicon oxide, and the etch mask material layer 274L includes a material selected from amorphous carbon, a dielectric metal oxide (such as aluminum oxide, hafnium oxide or tantalum oxide), a dielectric metal nitride (such as aluminum nitride) and a silicon oxide having a different etch rate than silicon oxide layers 132, 170 and 180. The thickness of the etch mask material layer 274L can be in a range from 3 nm to 60 nm (such as from 6 nm to 30 nm), although lesser and greater thicknesses can also be employed. A backside cavity 79' is present within each unfilled volume of the backside trenches 79. The entire volume of each backside trench 79' can be located above a horizontal plane including the bottom surface of the inter-tier dielectric material layer 180.

Figure 8:
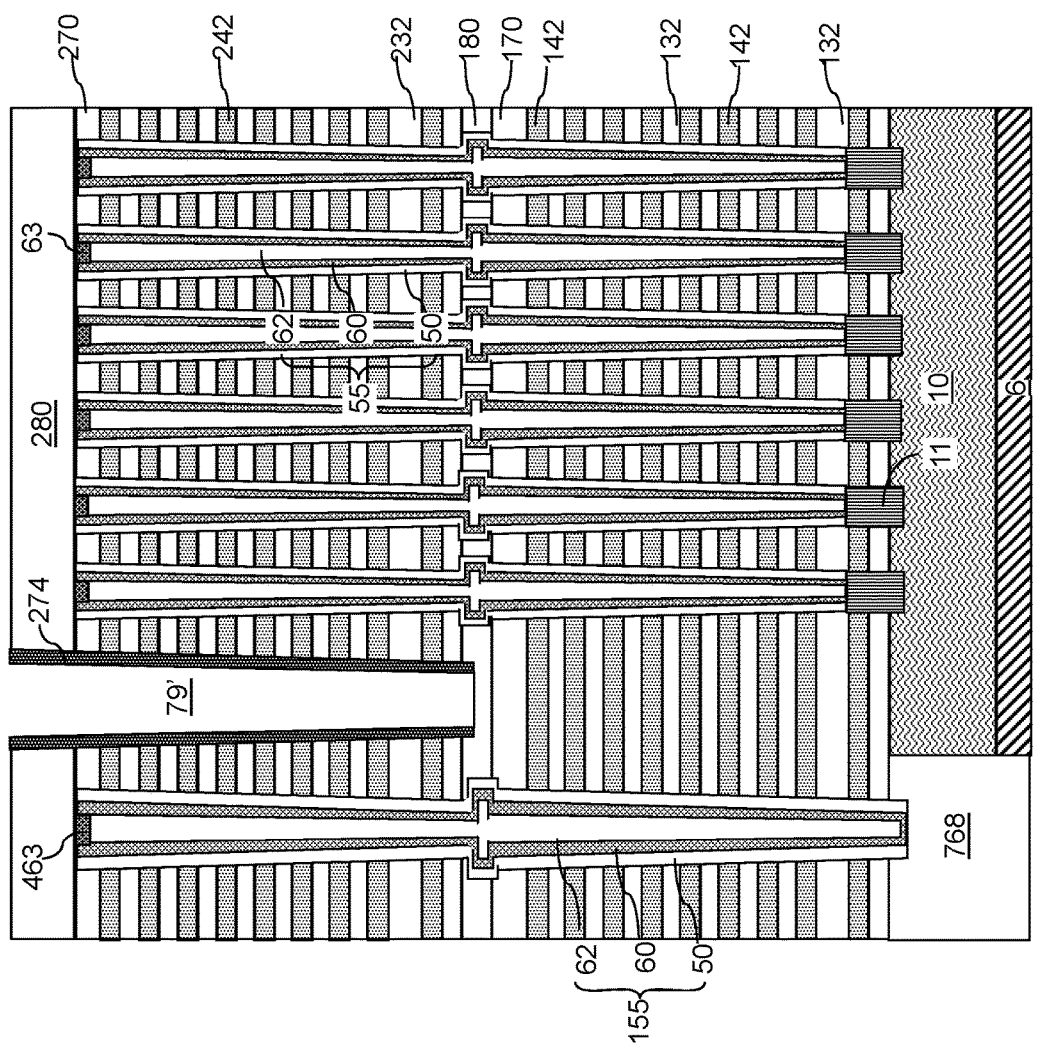
FIG. 8 is a magnified view of the array region after formation of an etch mask spacer by anisotropically etching the etch mask layer according to an embodiment of the present disclosure.

Referring to FIG. 8, an anisotropic etch process (e.g., a sidewall spacer etch process) can be performed to remove horizontal portions of the etch mask material layer 274L. Each remaining vertical portion of the etch mask material layer 274L can have a configuration of an elongated cylinder, and is herein referred to as an etch mask spacer 274. Each etch mask spacer 274 covers sidewalls of a respective one of the backside trenches 79. In one embodiment, each etch mask layer 274 can contact a substantially horizontal top surface of the inter-tier dielectric material layer 180. The etch mask spacers 274 include a material that is resistant to hot phosphoric acid, and are located at a periphery of a respective one of the backside trenches 79.

Figure 9:
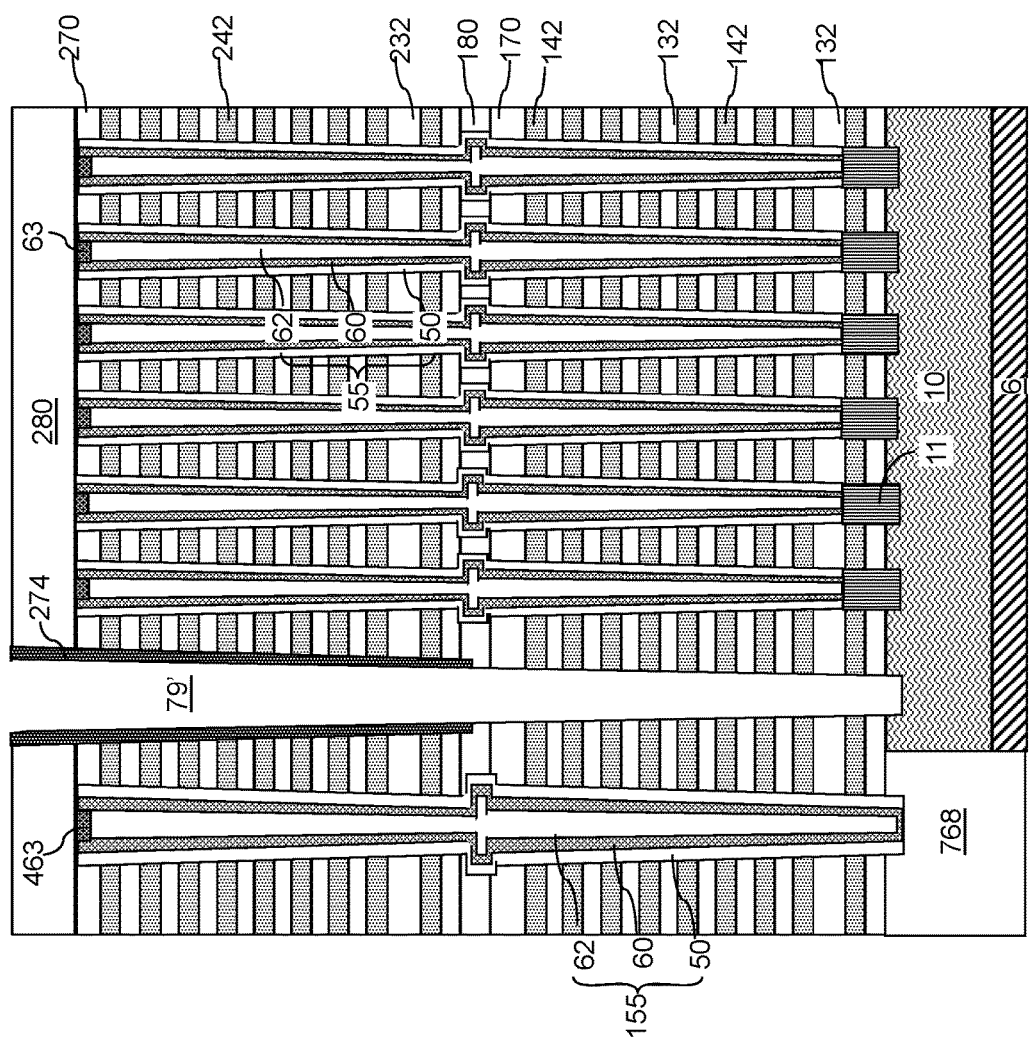
FIG. 9 is a magnified view of the array region after extending the backside trench through the first tier structure according to an embodiment of the present disclosure.

Referring to FIG. 9, each backside trench is vertically extended through a lower portion of the at least one alternating stack. If the at least one alternating stack includes the first alternating stack (132, 142) and the second alternating stack (232, 242), the backside trenches can be extended through the first alternating stack (132, 142), and a top surface of the planar semiconductor material layer 10 can be physically exposed at the bottom of each vertically extended backside trench. If the at least one alternating stack includes only a single alternating stack of insulating layers and silicon nitride layers, the backside trenches can be vertically extended through lower layers within the single alternating stack. In one embodiment, the sidewalls of the first insulating layers 132 and the first silicon nitride layers 142 can be physically exposed around each backside trench.

For example, the contact level dielectric layer 280 can be used as an etch mask during the etching step shown in FIG. 9. For example, layer 280 may be a silicon oxide layer formed from a TEOS source followed by densification anneal of the layer (i.e., a densified TEOS ("dTEOS") silicon oxide layer), which has a higher resistance of anisotropic etching than the underlying silicon oxide layers (132, 170, 180). Alternatively, a hard mask layer (not shown) can be used as an etch mask in the etching step of FIG. 9. The hard mask layer can be anisotropically deposited to cover the top surface of the contact level dielectric layer 280 with a greater thickness than bottom portions of the backside trenches 79. For example, a carbon-based advanced patterning film (APF) provided by Applied Materials, Inc.® can be employed. The thickness of the advanced patterning film on the sidewalls of the etch mask spacers 274 can be less than the thickness of the advanced patterning film at the bottom portions of the backside trenches 79. The advanced patterning film can be etched back so that the remaining portions of the advanced patterning film cover only the top surface of the contact level dielectric layer. An anisotropic etch can be performed to etch through portions of the inter-tier dielectric material layer 180, the first insulating cap layer 170, and the first alternating stack (132, 142). The advanced patterning film can be subsequently removed, for example, by ashing.

Alternatively, a photoresist layer (not shown) can be applied and lithographically patterned to cover top surfaces of the contact level dielectric layer 280, while not covering the areas of the backside cavities 79'. In one embodiment, sidewalls of the patterned photoresist layer can be formed on top surfaces of the etch mask spacers 274. An anisotropic etch can be performed to etch through portions of the inter-tier dielectric material layer 180, the first insulating cap layer 170, and the first alternating stack (132, 142). The patterned photoresist layer can be subsequently removed, for example, by ashing.

Figure 10:
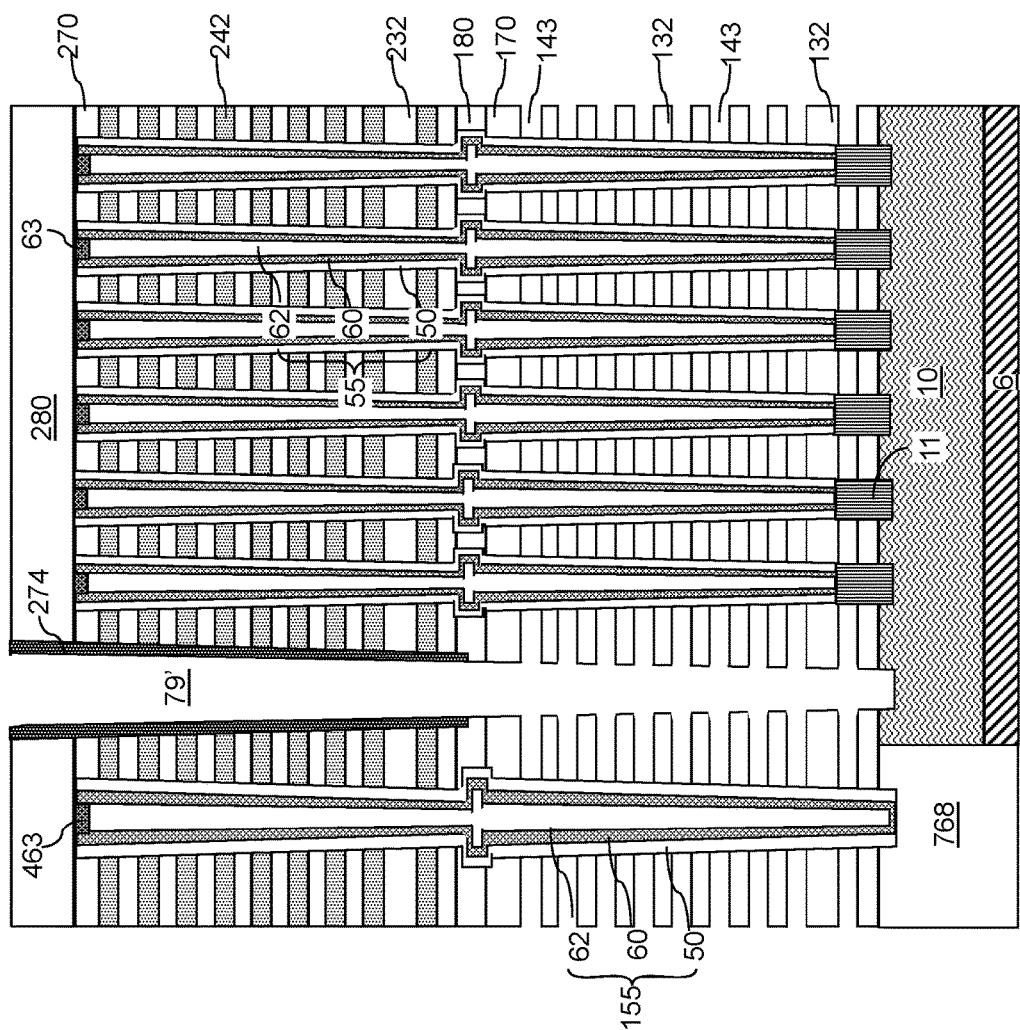
FIG. 10 is a magnified view of the array region after formation of first lateral recesses by removal of first silicon nitride layers according to an embodiment of the present disclosure.

Referring to FIG. 10, a first hot phosphoric acid wet etch process is performed to remove the materials of the first silicon nitride layers 142 selective to the materials of the first insulating layers 132, the first insulating cap layer 170, the inter-level dielectric material layer 180, the etch mask spacers 274, the contact level dielectric layer 280, the outermost layer of the memory films 50, and the planar semiconductor material layer 10. For example, the first insulating layers 132, the first insulating cap layer 170, and the inter-level dielectric material layer 180 can include silicon oxide, and the etch mask spacers 274 can include aluminum oxide. The etch mask spacers 274 protect the second silicon nitride layer 242 from being etched during this etching step.

First lateral recesses 143 are formed by removing a subset of the silicon nitride layers that are not covered by the etch mask spacers 274 selective to the insulating layers during the first hot phosphoric acid wet etch process. For example, if the memory-level assembly includes the first alternating stack (132, 142) and the second alternating stack (232, 242) and if the etch mask spacers 274 cover sidewalls of the layers in the second alternating stack (232, 242) and the sidewalls of the layers in the first alternating stack (132, 142) are physically exposed prior to the first hot phosphoric acid wet etch process, then first lateral recesses 143 are formed in volumes from which the first silicon nitride layers 142 are removed. Each of the first lateral recesses 143 can be a laterally extending cavity having a lateral dimension that is greater than the vertical extent of the cavity. In other words, the lateral dimension of each of the first lateral recesses 143 can be greater than the height of the respective first lateral recess 143. In one embodiment, each of the first lateral recesses 143 can have a uniform height throughout.

The selectivity of a hot phosphoric acid wet etch process between silicon nitride and silicon oxide is defined as the ratio of the etch rate of silicon nitride to the etch rate of silicon oxide. The selectivity of the hot phosphoric acid wet etch process between silicon nitride and silicon oxide depends on the concentration of residual silicon in the hot phosphoric acid. Generally, the higher the concentration of residual silicon in a hot phosphoric acid, the greater the selectivity of the hot phosphoric acid wet etch process between silicon nitride and silicon oxide. Thus, presence of some residual silicon, such as at least 60 parts per million of silicon, in hot phosphoric acid is desired in order to provide a high selectivity for the first hot phosphoric acid wet etch process.

However, silicon has a solubility limit of about 90 parts per million at a temperature of 160 degrees, which is the typical temperature of a hot phosphoric acid bath. Without wishing to be bound by a particular theory, the present inventors recognized that presence of residual silicon in the hot phosphoric acid at above a certain concentration, such as at greater than a total of 90 parts per million, induces formation of the silicon containing material (e.g., silicon, silica, silicon hydroxide and/or siloxane as described above) which deposits on the edges of the silicon oxide layer 132 in the backside trench 79 and clogs the inlets. The present inventors of also recognized that the amount of silicon nitride material that is removed from at least one alternating stack of insulating layers and silicon nitride layers that include a high number of silicon nitride layers (such as at least 80 silicon nitride layer, for example 96 silicon nitride layers, 108 silicon nitride layers, or more) can generate a significant gradient in silicon concentration within backside trenches 79 if all sidewalls of the silicon nitride layers (142, 242) are physically exposed to the backside trenches during a single hot phosphoric acid wet etch process. The gradient is believed to result in more silicon settling to the bottom of the backside trench 79 than being located at the top of the backside trench 79.

In one embodiment, by reducing the total number of silicon nitride layers that are physically exposed to the hot phosphoric acid during the first hot phosphoric acid wet etch process (e.g., by exposing only the first silicon nitride layers 142 to the hot phosphoric acid and not exposing the second silicon nitride layers 242 to the hot phosphoric acid during the first hot phosphoric acid wet etch process), the silicon concentration within the hot phosphoric acid solution of the first hot phosphoric acid wet etch processes can be maintained between 60 and 90 parts per million, such as between 70 and 80 parts per million throughout an entire volume of the hot phosphoric acid solution during the first hot phosphoric acid wet etch process. Thus, the total silicon concentration (i.e., the sum of the silicon generated from the etching and the silicon contained in the original hot phosphoric acid solution just prior to etching) in the hot phosphoric acid solution at the bottom of the backside trench 79 is preferably below 90 parts per million during the first wet etch process. Therefore, even if the original hot phosphoric acid solution just prior to etching contains a certain level of silicon, then etching just part of the silicon nitride layers during the etch reduces the amount of additional silicon provided into the solution during the etch process, and permits the total silicon concentration at the bottom of the trench to be 90 ppm or less. The decreased silicon concentration also permits the width of the backside trench 79 to be narrower than in prior art devices, since narrower trenches are believed to contribute to an increased silicon concentration gradient.

Figure 11:
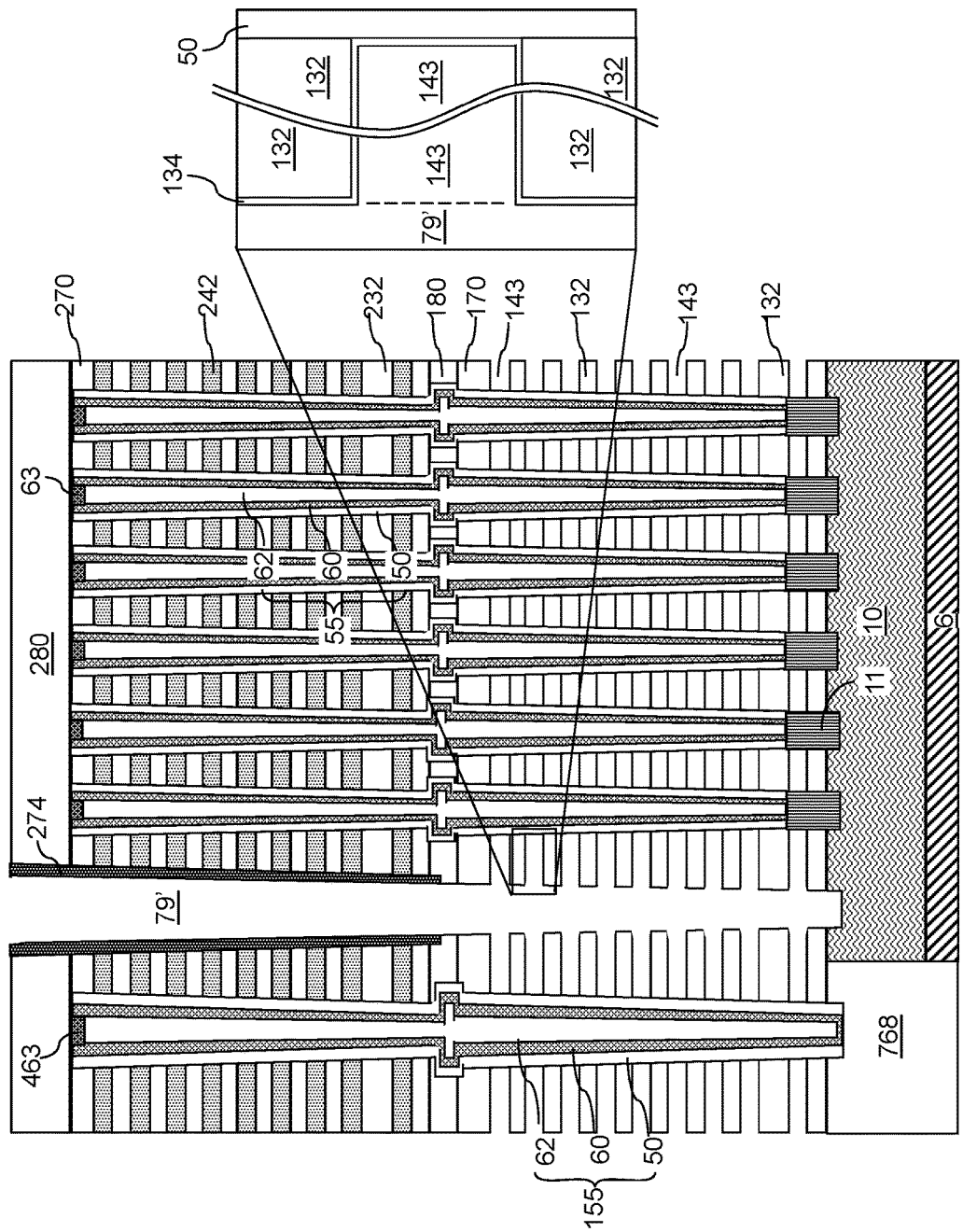
FIG. 11 is a magnified view of the array region after formation of a conformal silicon oxide liner according to an embodiment of the present disclosure.

Referring to FIG. 11, the volume of each of the first lateral recesses 143 can be reduced by depositing an optional conformal silicon oxide liner 134. The conformal silicon oxide liner 134 can be deposited by a conformal deposition process such as chemical vapor deposition or atomic layer deposition. The conformal silicon oxide liner 134 can be deposited at peripheries of the first lateral recesses 143, on sidewalls of the memory stack structures 55 and the support pillar structures 155, and at peripheries of the backside cavities 79'.

Without the conformal silicon oxide liner 134, surfaces of the first insulating layers 132 would be exposed to hot phosphoric acids of the first hot phosphoric acid wet etch process that forms the first lateral recesses 143 and a second hot phosphoric acid wet etch process that is subsequently performed to remove the second nitride layers 242. Due to finite selectivity of the hot phosphoric wet etch processes, collateral etching of the first insulating layers 132 would occur during both of the first and second hot phosphoric acid wet etch processes. The conformal silicon oxide liner 134 can compensate for the loss of thickness in the first insulating layer 132 during the first hot phosphoric acid wet etch process. Further, a surface portion of the conformal silicon oxide liner 134 can function as a sacrificial material layer during a subsequent second hot phosphoric acid wet etch process that is employed to remove the second silicon nitride layers 242.

The thickness of the conformal silicon oxide liner 134 can be selected to compensate for the loss of thickness in the first insulating layers 132 by the combination of the first and second hot phosphoric wet etch processes. For example, the thickness of the conformal silicon oxide liner 134 can be in a range from 1 nm to 3 nm, although lesser and greater thicknesses can also be employed.

Figure 12:
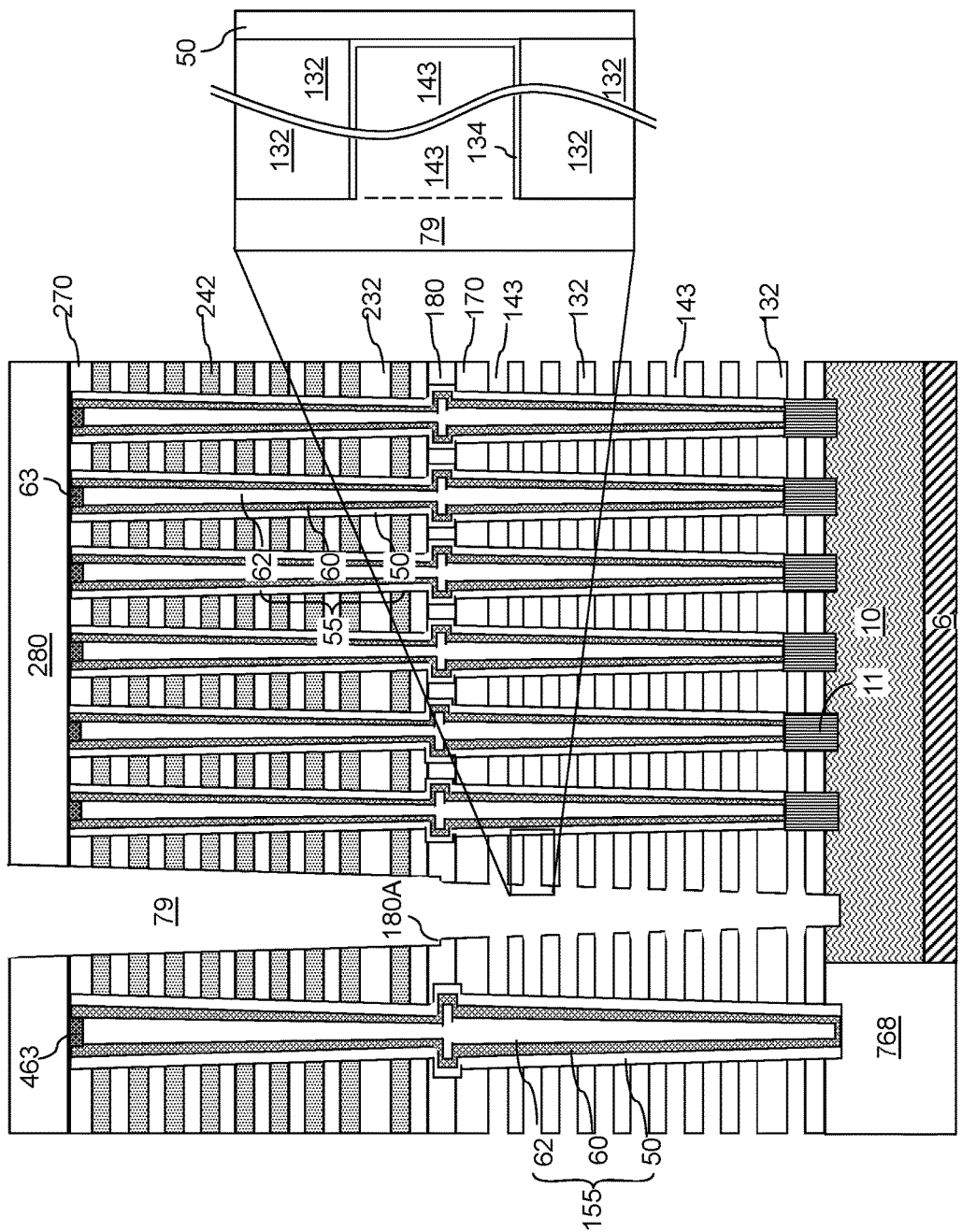
FIG. 12 is a magnified view of the array region after removal of vertical portions of the conformal silicon oxide liner at a periphery of each backside trench and removal of the etch mask spacer according to an embodiment of the present disclosure.

Referring to FIG. 12, an optional anisotropic etch process or a depletive isotropic etch process (i.e., an isotropic etch process in which scarcity of the etchant causes significant reduction of the etch rate in regions that are remote from supply regions of the etchants) can be performed to remove portions of the conformal silicon oxide liner 134 from inside the backside trenches. For example, a reactive ion etch employing hydrofluorocarbon etchants or fluorocarbon etchants can be employed. The portions of the conformal silicon oxide liner 134 located inside the first lateral recesses 143 can remain substantially intact, while the portions of the conformal silicon oxide liner 134 in the backside trenches are removed. Alternatively, formation of the silicon oxide liner 134 can be omitted if the blocking dielectric 51 comprises an etch resistant dielectric material, such as aluminum oxide.

Subsequently, the etch mask spacers 274 can be removed selective to the first and second insulating layers (132, 232) by an isotropic etch process or an anisotropic etch process. For example, if the etch mask spacers 274 include aluminum oxide, then a wet etch process can be employed to remove the etch mask spacers 274. If the etch mask spacers 274 include carbon, then an ashing process can be employed to remove the etch mask spacers 274. After removal of the etch mask spacers, a step 180A may be present in inter-tier dielectric material layer 180.

Figure 13:
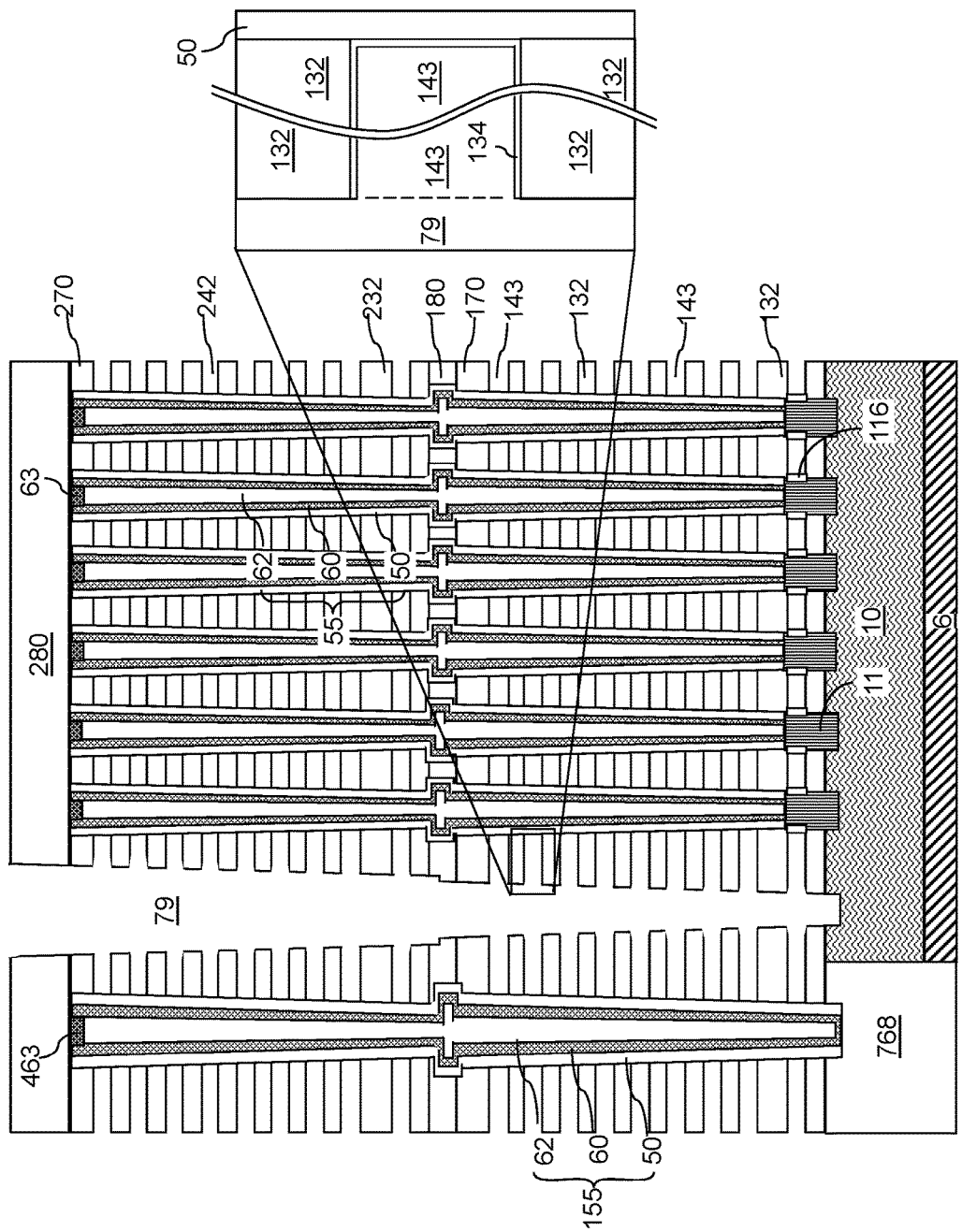
FIG. 13 is a magnified view of the array region after formation of second lateral recesses by removal of second sacrificial material layers according to an embodiment of the present disclosure.

Referring to FIG. 13, second lateral recesses 243 can be formed by removing a complementary subset of the silicon nitride layers (i.e., the set of silicon nitride layers that are not removed during the first hot phosphoric acid wet etch process) selective to the insulating layers employing a second hot phosphoric acid wet etch process.

For example, if the memory-level assembly includes the first alternating stack (132, 142) and the second alternating stack (232, 242), second lateral recesses 243 are formed in volumes from which the second silicon nitride layers 242 are removed. Each of the second lateral recesses 243 can be a laterally extending cavity having a lateral dimension that is greater than the vertical extent of the cavity. In other words, the lateral dimension of each of the second lateral recesses 243 can be greater than the height of the respective second lateral recess 243. In one embodiment, each of the second lateral recesses 243 can have a uniform height throughout. Subsequently, annular spacer dielectrics 116 can be formed by oxidizing surface portions of the pedestal channel portions 11.

In one embodiment, by reducing the total number of silicon nitride layers that are physically exposed to the hot phosphoric acid during the second hot phosphoric acid wet etch process (e.g., by exposing only the second silicon nitride layers 242 to the hot phosphoric acid because the first silicon nitride layers 142 are already removed by the first hot phosphoric acid wet etch process), silicon concentration within the hot phosphoric acid solution of the second hot phosphoric acid wet etch processes can be maintained within a range from 60 parts per million and 90 parts per million throughout an entire volume of the hot phosphoric acid solution during the second hot phosphoric acid wet etch process.

According to an aspect of the present disclosure, the silicon nitride layers within the memory-level assembly are divided into multiple groups, and are sequentially exposed to different hot phosphoric acid baths employing multiple hot phosphoric acid wet etch processes. While the present disclosure is described employing an embodiment in which a two-tier structure is employed for illustrative purposes, different etch mask spacers 274 employing at least two different materials can be formed at each tier level other than the bottommost tier level of a multi-tier memory-level assembly. Such variations are expressly contemplated herein.

Figure 14:
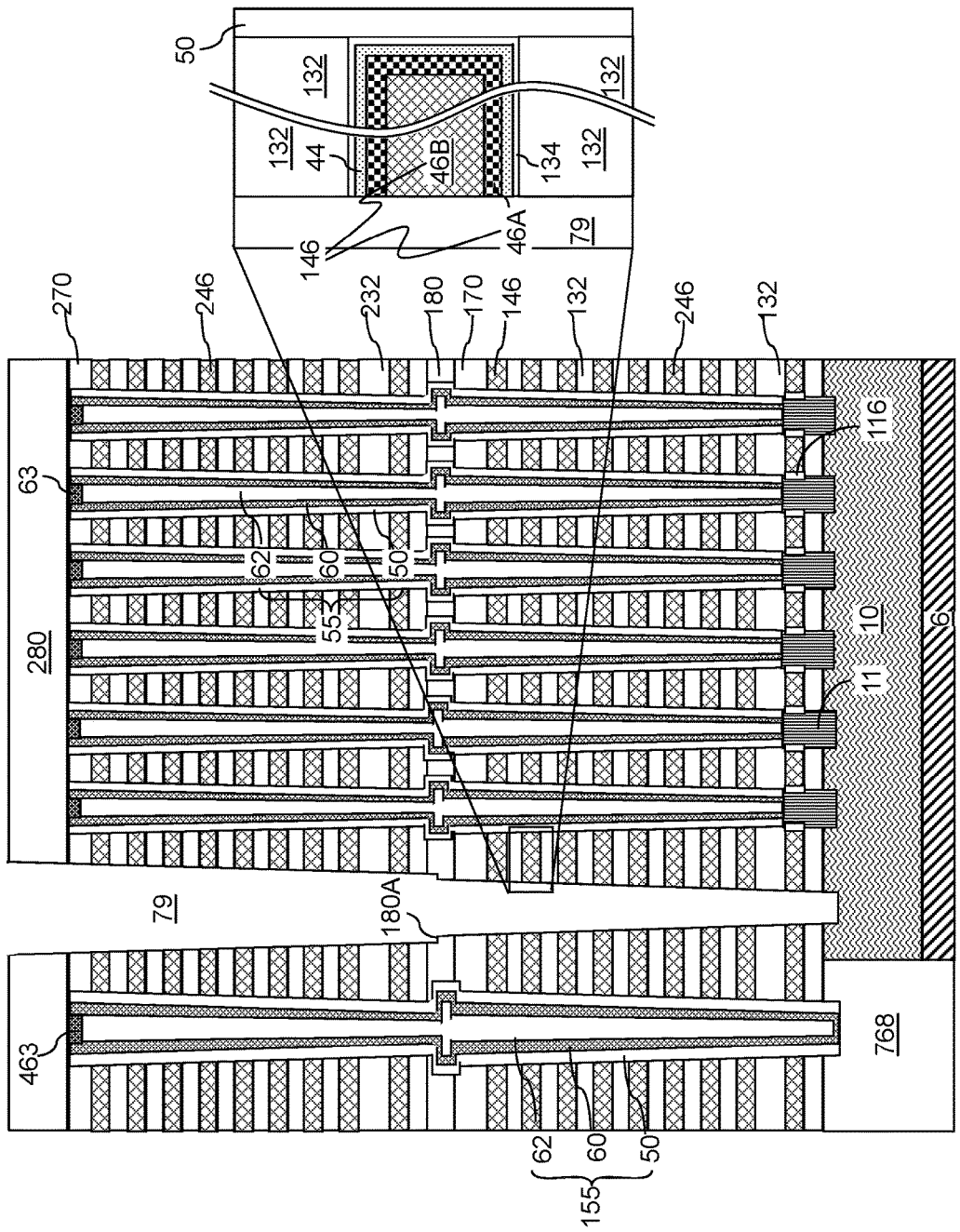
FIG. 14 is a magnified view of the array region after formation of a backside blocking dielectric layer and electrically conductive layers according to an embodiment of the present disclosure.

Referring to FIG. 14, a backside blocking dielectric layer 44 can be optionally deposited in the lateral recesses (143, 243) and the backside trenches 79 and over the contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of lateral recesses (143, 243), at peripheral portions of the backside trenches 79 (i.e., on the sidewalls of the backside trenches 79), and over the contact level dielectric layer 280. The at least one conductive material can include at least one metallic material, i.e., an electrically conductive material that includes at least one metallic element. The first lateral recesses 143 and the second lateral recesses 243 are simultaneously filled by deposition of the at least one conductive material, which forms electrically conductive layers (146, 246).

The at least one conductive material can be deposited in the lateral recesses (143, 243) employing a respective reactant introduced through the backside trenches 79. A plurality of first electrically conductive layers 146 can be formed in the plurality of first lateral recesses 143, a plurality of second electrically conductive layers 246 can be formed in the plurality of second lateral recesses 243, and a continuous metallic material layer (not shown) can be formed on the sidewalls of each backside trench 79 and over the contact level dielectric layer 280. Thus, the first and second sacrificial material layers (142, 242) can be replaced with the first and second conductive material layers (146, 246), respectively. Specifically, each first silicon nitride layer 142 can be replaced with a portion of the optional backside blocking dielectric layer and a first electrically conductive layer 146, and each second sacrificial material layer 242 can be replaced with a portion of the optional backside blocking dielectric layer and a second electrically conductive layer 246. A backside cavity is present in the portion of each backside trench 79 that is not filled with the continuous metallic material layer.

The at least one metallic material can be deposited by a conformal deposition method, which can be, for example, chemical vapor deposition (CVD), atomic layer deposition (ALD), electroless plating, electroplating, or a combination thereof. The at least one metallic material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the lateral recesses (143, 243) include tungsten, tungsten nitride, titanium, titanium nitride, tantalum, tantalum nitride, cobalt, and ruthenium. In one embodiment, the at least one metallic material can comprise a combination of a conductive metal nitride and an elemental metal. For example, each of the first electrically conductive layers 146 and the second electrically conductive layers 246 can include a metallic nitride portion 46A and a metal fill portion 46B. The metallic nitride portion 46A can include a conductive metallic nitride such as TiN, TaN, or WN. The metal fill portion 46B can include a metal such as tungsten, copper, cobalt, or ruthenium.

Portions of the deposited at least one conductive material can be removed from the peripheral portions of the backside trenches 79 and from above the contact level dielectric layer 280. Specifically, the deposited metallic material(s) of the continuous metallic material layer can be etched back from the sidewalls of each backside trench 79 and from above the contact level dielectric layer 280, for example, by an isotropic etch. Each remaining portion of the deposited metallic material(s) in the first lateral recesses 143 constitutes a first electrically conductive layer 146. Each remaining portion of the deposited metallic material(s) in the second lateral recesses 243 constitutes a second electrically conductive layer 246. Each electrically conductive layer (146, 246) can be a conductive line structure. The electrically conductive layers (146, 246) constitute word lines for the memory stack structures 55.

A subset of the second electrically conductive layers 246 located at the levels of the drain-select-level shallow trench isolation structures 72 constitutes drain select gate electrodes. A subset of the first electrically conductive layers 146 located at each level of the annular spacer dielectrics 116 constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the semiconductor substrate 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

In one embodiment, each backside trench 79 can include a horizontal step 180A at the level of the inter-tier dielectric material layer 180. The horizontal steps in the inter-tier dielectric material layer 180 correspond to the interfaces between the etch mask spacers 274 and the inter-tier dielectric material layer 180, and thus, the width of the horizontal steps in the inter-tier dielectric material layer 180 can be about the thickness of the etch mask spacers 274.

Figure 15A:
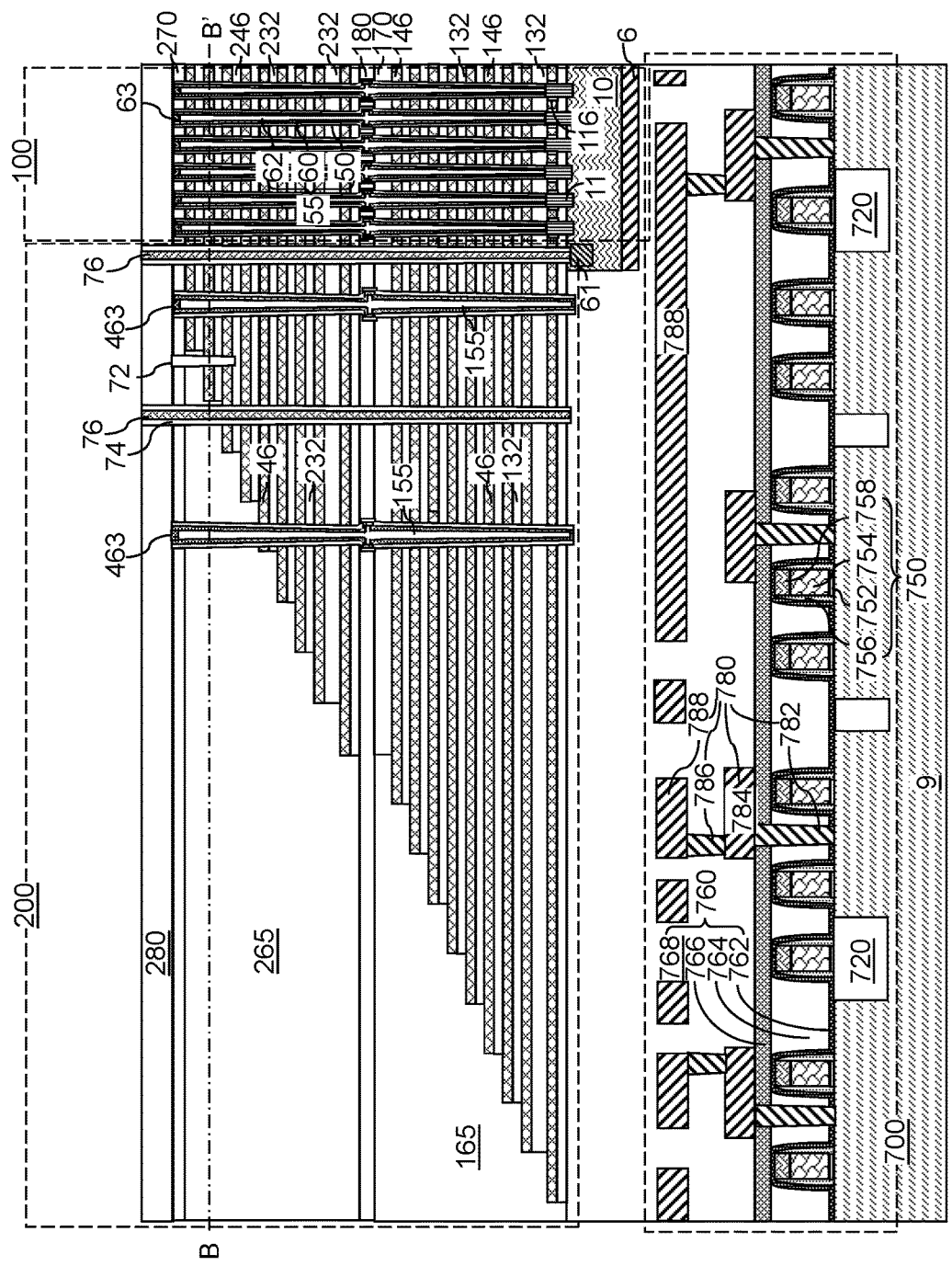
FIG. 15A is a vertical cross-sectional view of the exemplary structure after formation of insulating spacers and backside contact via structures according to an embodiment of the present disclosure.
Figure 15C:
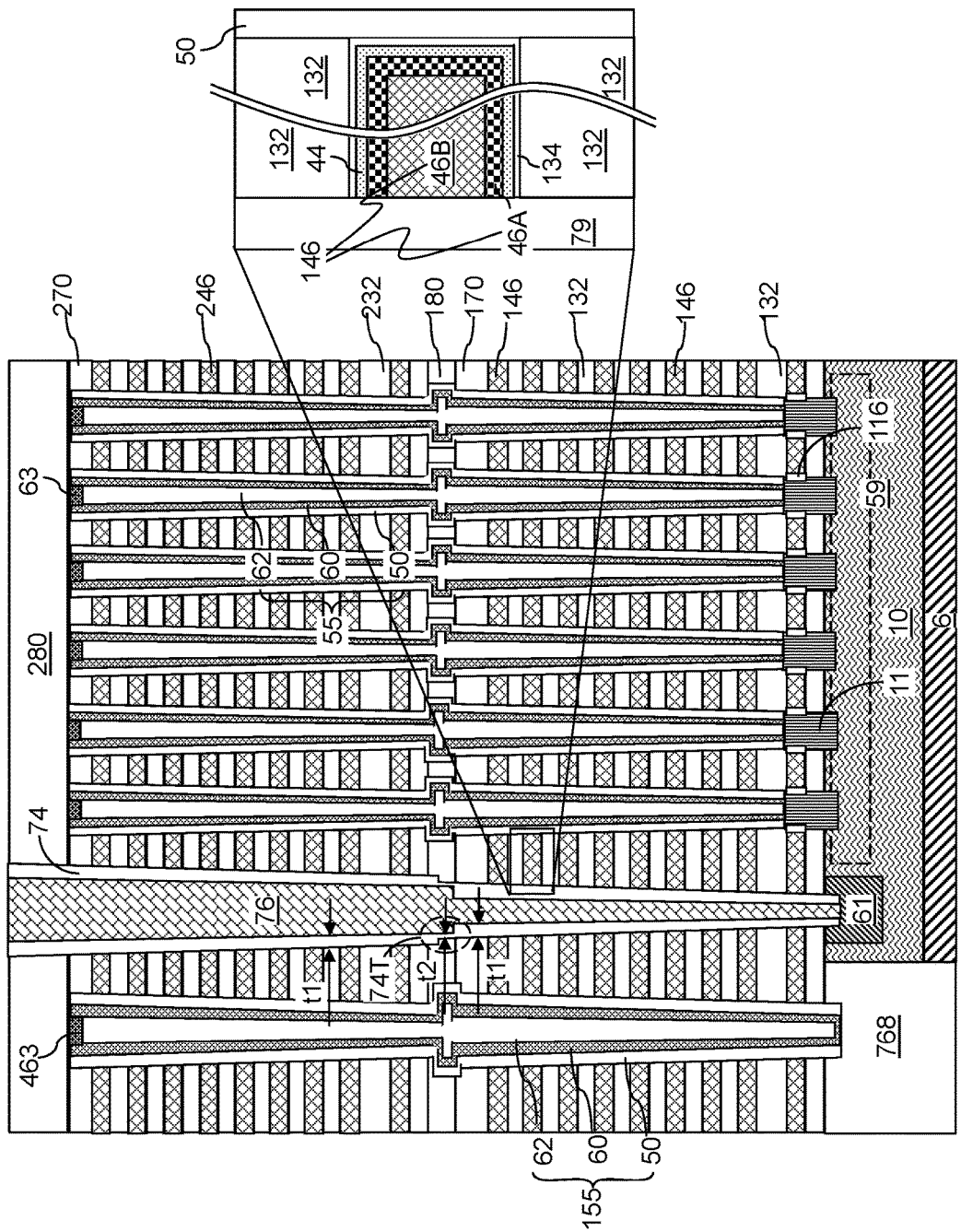
FIG. 15C is a magnified view of the array region of exemplary structure of FIG. 15A.

Referring to FIGS. 15A-15C, dopants of a second conductivity type, which is the opposite of the first conductivity type of the planar semiconductor material layer 10, can be implanted into a surface portion of the substrate semiconductor layer 10 to form a source region 61 underneath the bottom surface of each backside trench 79. An insulating spacer 74 including a dielectric material can be formed at the periphery of each backside trench 79, for example, by deposition of a conformal insulating material (such as silicon oxide) and a subsequent anisotropic etch. The contact level dielectric layer 280 may be thinned due to a collateral etch during the anisotropic etch that removes the vertical portions of horizontal portions of the deposited conformal insulating material.

A conformal insulating material layer can be deposited in the backside trenches 79, and can be anisotropically etched to form insulating spacers 74. The insulating spacers 74 include an insulating material such as silicon oxide, silicon nitride, and/or a dielectric metal oxide. The inner sidewalls of the conformal insulating material layer replicate the contour of the sidewalls of the backside trenches 79. Thus, the inner surfaces of the conformal insulating material layer in a backside trench 79 includes an upper surface located at the level of the second-tier structure, a lower surface located at the level of the first-tier structure, and a horizontal step connecting the upper surface and the lower surface. The thickness of the conformal insulating material layer, which is herein referred to as a first thickness t1, can be greater than the width of the steps in the inter-tier dielectric material layer 180. A cavity laterally extending along the first horizontal direction hd1 is present within each insulating spacer 74.

An anisotropic etch is performed to remove horizontal portions of the conformal insulating material layer. The duration of the anisotropic etch can be selected such that the etch depth is greater than the thickness of the conformal insulating material layer. In this case, the inner surface of the upper portion of the conformal insulating material layer in the second-tier structure vertically extends downward below the height of the steps in the inter-tier dielectric material layer 180, and to provide a thinned region in which the remaining material of the conformal insulating material layer has a lesser thickness. Each remaining continuous portion of the conformal insulating material layer in the backside trenches constitutes an insulating spacer 74.

Each insulating spacer 74 comprises an upper portion embedded within the second-tier structure (or an upper portion of the at least one alternating stack of insulating layers and electrically conductive layers) and having the first thickness t1, a lower portion embedded within the first-tier structure (or a lower portion of the at least one alternating stack of insulating layers and electrically conductive layers) and having the first thickness t1, and an interconnection portion 74T having a second thickness t2 that is less than the first thickness t1 and vertically connecting the upper portion and the lower portion. In one embodiment, the outer surface of the insulating spacer 74 can have a horizontal step at a height at which the upper portion adjoins the interconnection portion 74T, and the inner surface of the insulating spacer 74 can have a horizontal step at a height at which the interconnection portion 74T adjoins the lower portion.

A backside contact via structure 76 can be formed in the remaining volume of each backside trench 79, for example, by deposition of at least one conductive material and removal of excess portions of the deposited at least one conductive material from above a horizontal plane including the top surface of the contact level dielectric layer 280 by a planarization process such as chemical mechanical planarization or a recess etch. The backside contact via structures are electrically insulated in all lateral directions, and are laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Each backside contact via structure 76 contacts a respective source region 61. The pattern of the horizontal steps in the inner sidewalls of the insulating spacers 74 is replicated in the sidewalls of the backside contact via structures 76. Thus, each backside contact via structure 76 can have a stepped sidewall in which an upper vertical or tapered surface is adjoined to a lower vertical or tapered surface through a horizontal step having a rectangular inner periphery and a rectangular outer periphery that are laterally spaced from each other by a uniform separation distance.

Figure 16A:
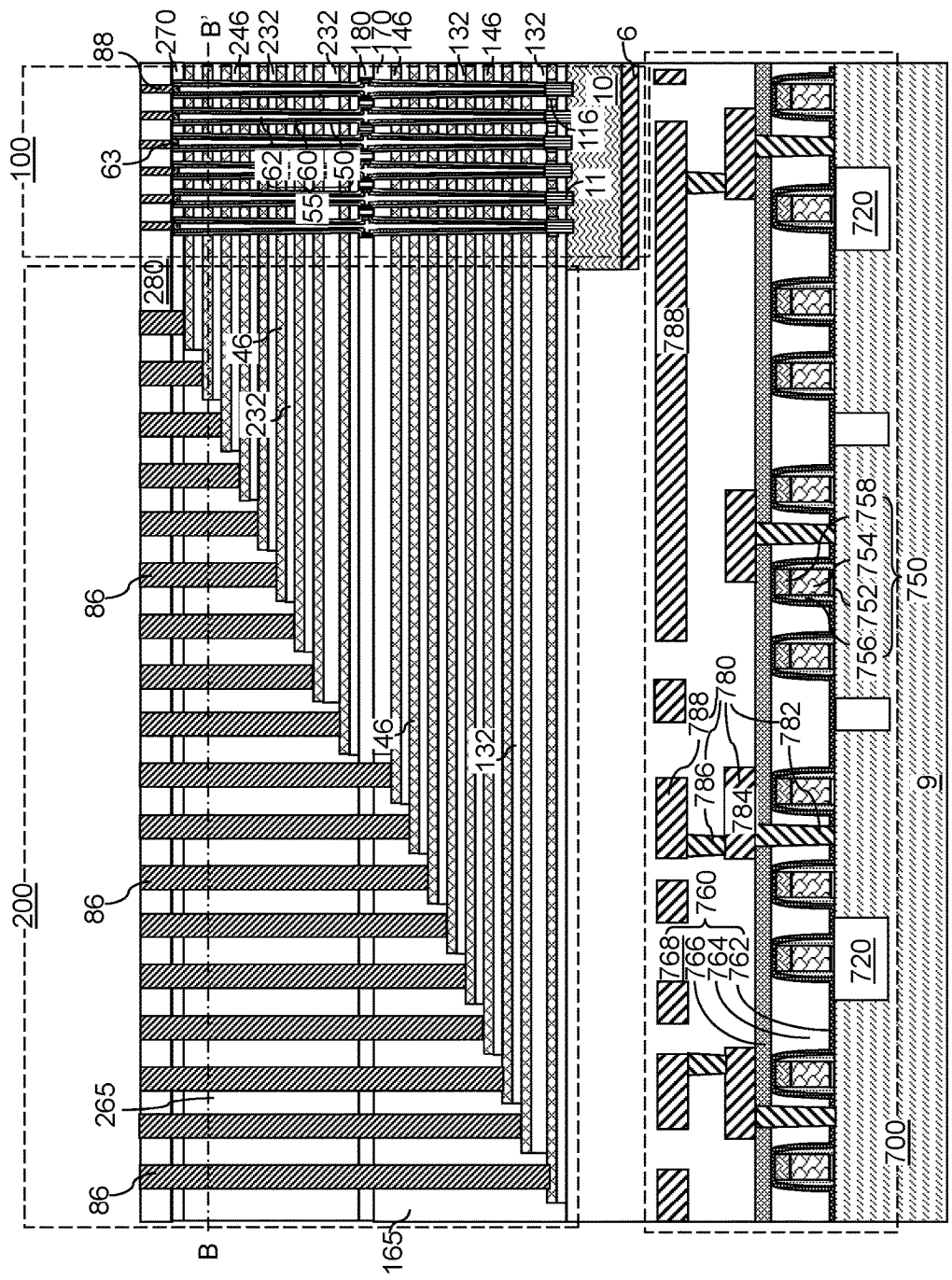
FIG. 16A is a vertical cross-sectional view of the exemplary structure after formation of various contact via structures according to an embodiment of the present disclosure.
Figure 16B:
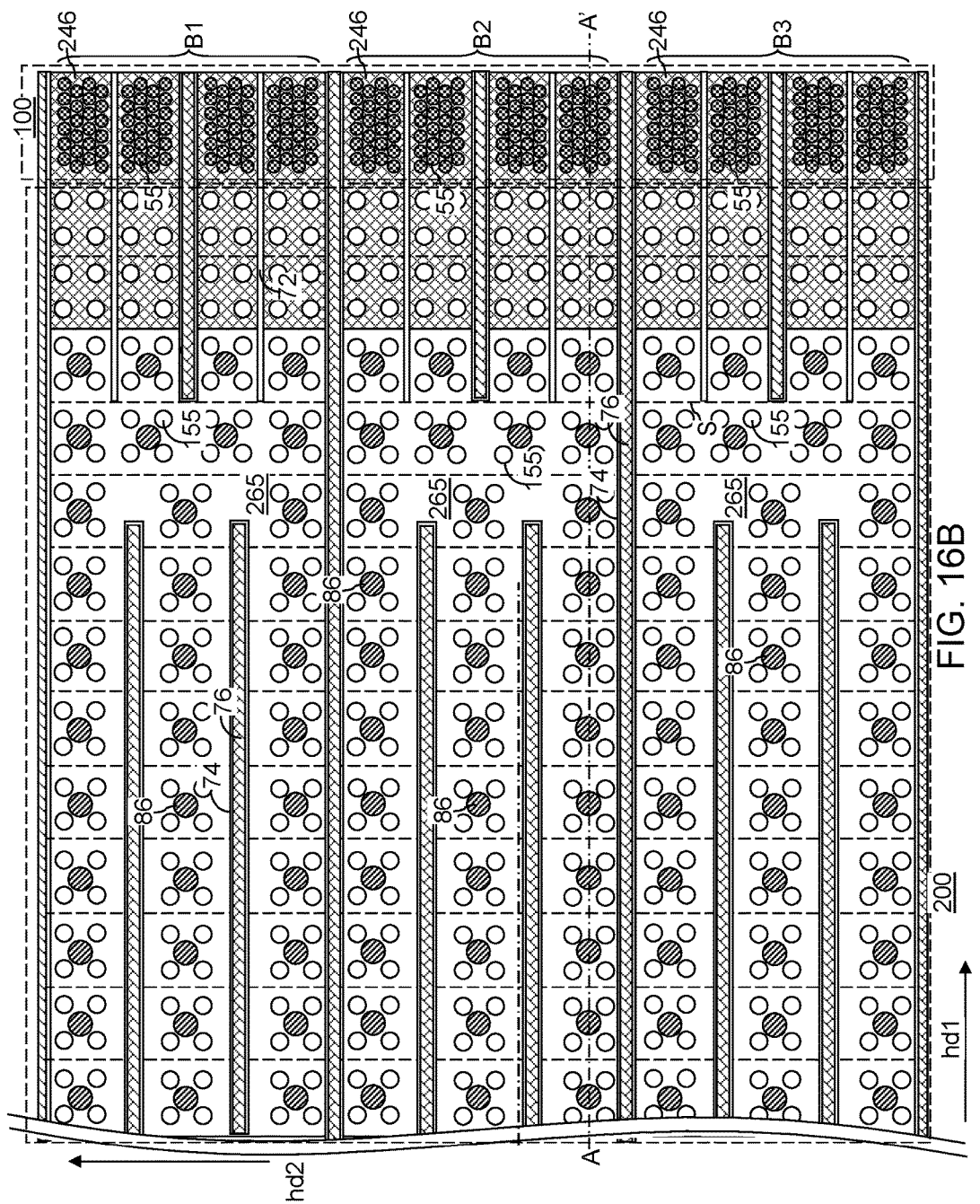
FIG. 16B is a horizontal cross-sectional view of the exemplary structure along the horizontal plane B-B' in FIG. 16A. The zig-zag vertical plane A-A' corresponds to the plane of the vertical cross-sectional view of FIG. 16A.

Referring to FIGS. 16A and 16B, additional contact via structures can be formed through the contact level dielectric layer 280 and underlying dielectric materials on various nodes of the memory device in the memory-level assembly. Specifically, word line contact via structures 86 can be formed through the contact level dielectric layer 280 and the second-tier retro-stepped dielectric material portion 265 and optionally, the first-tier retro-stepped dielectric material portion 165 in the word line contact via region 200. A subset of the word line contact via structures 86 contacting the second electrically conductive layers 246 extends through the second-tier retro-stepped dielectric material portion 265, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165.

Drain contact via structures 88 contacting the drain regions 63 can extend through the contact level dielectric layer 280 and the second insulating cap layer 270 in region 100. Each contact via structure (86, 88) may be formed employing a respective set of patterning processes and fill processes. Alternatively, two or more types of contact via structures (86, 88) may be formed employing a common set of patterning processes and fill processes provided that the anisotropic etch process therein can control vertical extent of cavities at target height levels for each type of cavities that are simultaneously formed.

Figure 17:
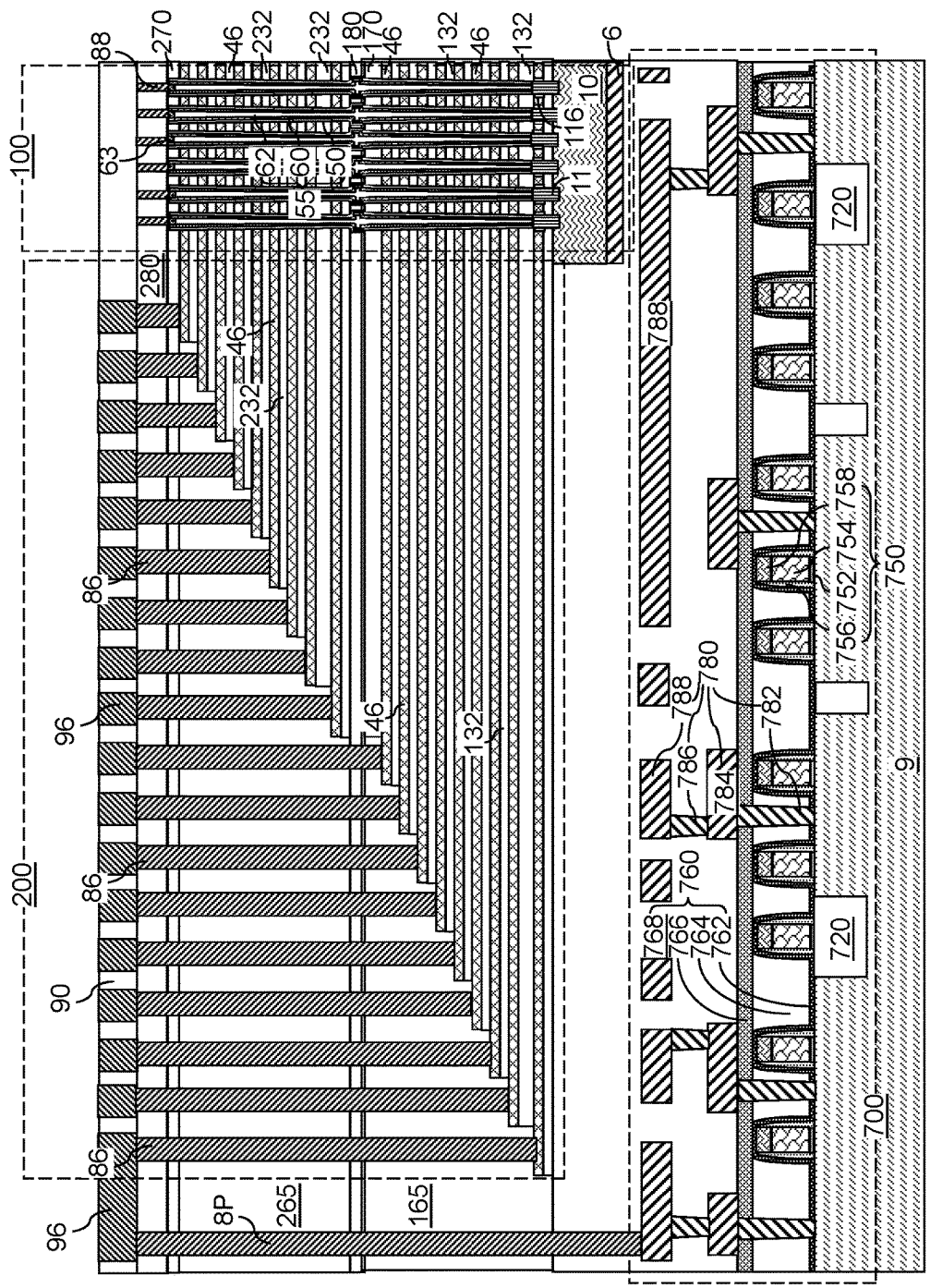
FIG. 17 is a vertical cross-sectional view of the exemplary structure after formation of through-memory-level via structures and upper level line structures according to an embodiment of the present disclosure.

Referring to FIG. 17, at least one through-memory-level via structures 8P can be formed through the contact level dielectric layer 280, the first and second retro-stepped dielectric material portions (165, 265), and one or more upper layers of the at least one lower level interconnect dielectric layer 768. Each of the at least one through-memory-level via structures 8P is a conductive via structure that is electrically shorted to one of the lower level metal interconnect structures 780 through one or more dielectric material portions located at the memory level, i.e., the level of the memory-level assembly that is the same level as the level of the at least one alternating stack.

Subsequently, at least one upper level dielectric layer 90 and upper level metal interconnect structures 96 are formed over the at least one alternating stack, e.g., the combination of the first alternating stack of the first insulating layers 132 and the first electrically conductive layers 146 and the second alternating stack of the second insulating layers 232 and the second electrically conductive layers 246. One or more of the upper level metal interconnect structures 96 can be electrically shorted to a respective one of the at least one through-memory-level via structures 8P. An electrically conductive path is provided between the driver circuitry for the memory array and the various nodes of the memory array through the combination of the lower level metal interconnect structures 780, the at least one through-memory-level via structures 8P, and the upper level metal interconnect structures 96. Furthermore, bit lines (not shown for clarity) can be formed in electrical contact with the drain contact via structures 88 through the upper level dielectric layer 90.

According to an aspect of the present disclosure, a three-dimensional memory device is provided, which comprises: at least one alternating stack of insulating layers (132, 232) and electrically conductive layers (146, 246) located over a substrate 9; memory stack structures 55 vertically extending through the at least one alternating stack (132, 146, 232, 246); a trench 79 vertically extending through the at least one alternating stack (132, 146, 232, 246); an insulating spacer 74 located at a peripheral portion of the trench 79 and vertically extending through an entirety of the at least one alternating stack (132, 146, 232, 246); and a contact via structure 76 located within the insulating spacer 74. The insulating spacer 74 comprises an upper portion having a first thickness t1, a lower portion having the first thickness t1, and an interconnection portion 74T having a second thickness t2 that is less than the first thickness t1 and vertically connecting the upper portion and the lower portion.

In one embodiment, the electrically conductive layers (146, 246) comprise word lines of a vertical NAND device, and the memory stack structures 55 comprise a vertical semiconductor channel 60 and a memory film 50 comprising charge storage elements 54.

In one embodiment, an outer surface of the insulating spacer 74 has a horizontal step at a height at which the upper portion adjoins the interconnection portion 74T, and an inner surface of the insulating spacer 74 has a horizontal step at a height at which the interconnection portion 74T adjoins the lower portion.

In one embodiment, the three-dimensional memory device further comprises: a semiconductor material 10 underlying the at least one alternating stack (132, 146, 232, 246) and electrically shorted to a lower end of each vertical semiconductor channel 60 within the memory stack structures 55, and a source region 61 located in an upper portion of the semiconductor material 10 and contacting a bottom surface of the contact via structure 76 and a bottom surface of the insulating spacer 74.

In one embodiment, the lower portion of the at least one alternating stack (132, 146, 232, 246) comprises a first alternating stack (132, 146) of first insulating layers 132 and first electrically conductive layers 146. The upper portion of the at least one alternating stack (132, 146, 232, 246) comprises a second alternating stack (232, 246) of second insulating layers 232 and second electrically conductive layers 246. An inter-tier dielectric material layer 180 having a greater thickness than any of the first and second insulating layers (132, 232) is formed between the first alternating stack (132, 146) and the second alternating stack (232, 246). The inter-tier dielectric material layer contains a horizontal step 180A. An upper portion of the insulating spacer 74 contacts the horizontal step 180A. An outer sidewall of the interconnection portion 74T contacts the inter-tier dielectric material layer 180 below the horizontal step 180A.

In one embodiment, the three-dimensional memory device further comprises: at least one field effect transistor located on the substrate 9; at least one lower level dielectric layer 760 and lower level metal interconnect structures 780 overlying the at least one field effect transistor; a planar semiconductor material layer 10 overlying the at least one lower level dielectric layer 760 and underlying the at least one alternating stack (132, 146, 232, 246); at least one conductive via structure 8P that is electrically shorted to one of the lower level metal interconnect structures 780 and extending through a dielectric material portion (165 or 265) located at a same level as the at least one alternating stack (132, 146, 232, 246); and at least one upper level dielectric layer 90 and upper level metal interconnect structures 96 overlying the at least one alternating stack (132, 146, 232, 246), wherein one of the upper level metal interconnect structures 96 is electrically shorted to the at least one conductive via structure 8P.

The exemplary structure and modifications thereof can include a three-dimensional memory structure. The memory stack structures 55 can comprise memory elements of a vertical NAND device. The electrically conductive layers (146, 246) can comprise, or can be electrically connected to, a respective word line of the vertical NAND device. The semiconductor substrate 9 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 9, a plurality of charge storage elements (as embodied as portions of the memory material layer 54 located at each word line level), each charge storage element located adjacent to a respective one of the plurality of semiconductor channels (59, 11, 60), and a plurality of control gate electrodes (as embodied as a subset of the electrically conductive layers (146, 246) having a strip shape extending substantially parallel to the top surface of the semiconductor substrate 9 (e.g., along the first horizontal direction hd1), the plurality of control gate electrodes comprise at least a first control gate electrode located in the first device level and a second control gate electrode located in the second device level.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming at least one alternating stack of insulating layers and silicon nitride layers over a substrate;
   forming memory stack structures through the at least one alternating stack;
   forming a trench through an upper portion of the at least one alternating stack;
   forming an etch mask spacer including a material resistant to hot phosphoric acid at a periphery of the trench;
   vertically extending the trench through a lower portion of the at least one alternating stack;
   forming first lateral recesses by removing a first subset of the silicon nitride layers that are not covered by the etch mask spacer selective to the insulating layers employing a first hot phosphoric acid wet etch process;
   removing the etch mask spacer;
   forming second lateral recesses by removing a second subset of the silicon nitride layers selective to the insulating layers employing a second hot phosphoric acid wet etch process; and
   forming electrically conductive layers in the first and second lateral recesses.

2. The method of claim 1, wherein silicon concentration within hot phosphoric acid solutions of the first and second hot phosphoric acid wet etch processes is maintained within a range from 60 parts per million to 90 parts per million throughout an entire volume of each of the hot phosphoric acid solutions in the trench during the first and second hot phosphoric acid wet etch processes.

3. The method of claim 1, wherein:
   each of the insulating layers comprise silicon oxide and has a thickness in a range from 15 nm to 40 nm; and
   each of the silicon nitride layers has a thickness in a range from 15 nm to 40 nm.

4. The method of claim 1, wherein the at least one alternating stack comprises at least 80 insulating layers and at least 80 silicon nitride layers.

5. The method of claim 1, further comprising forming an insulating cap material including a material other than silicon nitride over the alternating stack, wherein the trench is formed through the insulating cap material layer.

6. The method of claim 1, wherein the first lateral recesses and the second lateral recesses are simultaneously filled by deposition of at least one conductive material that forms the electrically conductive layers.

7. The method of claim 1, further comprising reducing a volume of each of the first lateral recesses by depositing a conformal silicon oxide liner at peripheries of the first lateral recesses before forming the second lateral recesses.

8. The method of claim 7, further comprising removing vertical portions of the conformal silicon oxide liner at a periphery of the trench by an anisotropic etch process.

9. The method of claim 1, wherein the etch mask spacer comprises a material selected from amorphous carbon, silicon oxide, a dielectric metal oxide, and a dielectric metal nitride.

10. The method of claim 1, further comprising:
    depositing at least one conductive material within the first and second lateral recesses and at peripheral portions of the trench; and
    removing portions of the deposited at least one conductive material from the peripheral portions of the trench, wherein remaining portions of the deposited at least one conductive material in the first and second lateral recesses constitute the electrically conductive layers.

11. The method of claim 1, wherein:
    the lower portion of the at least one alternating stack comprises a first alternating stack of first insulating layers and first silicon nitride layers; and
    the upper portion of the at least one alternating stack comprises a second alternating stack of second insulating layers and second silicon nitride layers; and
    an inter-tier dielectric material layer having a greater thickness than any of the first and second insulating layers is formed between the first alternating stack and the second alternating stack.

12. The method of claim 11, wherein:
    the inter-tier dielectric material layer contains a horizontal step in the trench; and
    the inter-tier dielectric material layer is employed as an etch stop layer during formation of the trench through the upper portion of the at least one alternating stack.

13. The method of claim 1, wherein the electrically conductive layers comprise word lines of a vertical NAND device, and the memory stack structures comprise a vertical semiconductor channel and a memory film comprising charge storage elements.

14. The method of claim 1, wherein:
    the memory stack structures comprise memory elements of a vertical NAND device;
    the electrically conductive layers comprise, or are electrically connected to, a respective word line of the vertical NAND device;
    the substrate comprises a silicon substrate;
    the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising the word line driver circuit and a bit line driver circuit for the memory device; and the array of monolithic three-dimensional NAND strings comprises:

a plurality of semiconductor channels, wherein at least one end portion of each of the plurality of semiconductor channels extends substantially perpendicular to a top surface of the semiconductor substrate;

a plurality of charge storage elements, each charge storage element located adjacent to a respective one of the plurality of semiconductor channels; and a plurality of control gate electrodes having a strip shape extending substantially parallel to the top surface of the substrate and embodied as portions of the electrically conductive layers, the plurality of control gate electrodes comprise at least a first control gate electrode located in the first device level and a second control gate electrode located in the second device level.

\* \* \* \* \*